United States Patent
Klein et al.

(10) Patent No.: US 11,386,020 B1
(45) Date of Patent: Jul. 12, 2022

(54) PROGRAMMABLE DEVICE HAVING A DATA PROCESSING ENGINE (DPE) ARRAY

(71) Applicant: XILINX, INC., San Jose, CA (US)

(72) Inventors: Matthew H. Klein, Redwood City, CA (US); Goran Hk Bilski, Molndal (SE); Juan Jose Noguera Serra, San Jose, CA (US); Ismed D. Hartanto, Castro Valley, CA (US); Sridhar Subramanian, San Jose, CA (US); Tim Tuan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 46 days.

(21) Appl. No.: 16/808,054

(22) Filed: Mar. 3, 2020

(51) Int. Cl.
  *G06F 15/17* (2006.01)
  *G06F 13/16* (2006.01)
  *G06F 9/30* (2018.01)
  *H03K 19/1776* (2020.01)
  *G06F 7/501* (2006.01)
  *G06F 15/173* (2006.01)

(52) U.S. Cl.
  CPC .......... *G06F 13/1657* (2013.01); *G06F 7/501* (2013.01); *G06F 9/30098* (2013.01); *G06F 13/1663* (2013.01); *G06F 13/1668* (2013.01); *G06F 15/17331* (2013.01); *H03K 19/1776* (2013.01)

(58) Field of Classification Search
  CPC .. G06F 13/1657; G06F 13/1663; G06F 7/501; G06F 9/30098; G06F 15/1773
  USPC ......................................................... 710/316
  See application file for complete search history.

(56) References Cited

U.S. PATENT DOCUMENTS

| | | | | |
|---|---|---|---|---|
| 5,522,045 | A * | 5/1996 | Sandberg | G06F 12/1072 709/215 |
| 6,728,258 | B1 * | 4/2004 | Okada | G06F 15/17375 370/463 |
| 7,139,271 | B1 * | 11/2006 | Parruck | H04L 12/5601 370/392 |
| 8,327,114 | B1 * | 12/2012 | Cismas | G06F 11/2051 712/16 |
| 8,327,187 | B1 * | 12/2012 | Metcalf | G06F 12/123 714/10 |
| 8,341,327 | B2 * | 12/2012 | Baba | G06F 13/387 710/316 |
| 8,458,267 | B2 | 6/2013 | Chen et al. | |
| 9,992,042 | B2 * | 6/2018 | Anders | H04L 12/66 |
| 2001/0052053 | A1 | 12/2001 | Nemirovsky | |

(Continued)

*Primary Examiner* — Christopher B Shin
(74) *Attorney, Agent, or Firm* — Patterson + Sheridan, LLP

(57) ABSTRACT

Some examples described herein relate to programmable devices that include a data processing engine (DPE) array that permits shifting of where an application is loaded onto DPEs of the DPE array. In an example, a programmable device includes a DPE array. The DPE array includes DPEs and address index offset logic. Each of the DPEs includes a processor core and a memory mapped switch. The processor core is programmable via one or more memory mapped packets routed through the respective memory mapped switch. The memory mapped switches in the DPE array are coupled together to form a memory mapped interconnect network. The address index offset logic is configurable to selectively modify which DPE in the DPE array is targeted by a respective memory mapped packet routed in the memory mapped interconnect network.

21 Claims, 9 Drawing Sheets

(56) References Cited

U.S. PATENT DOCUMENTS

| | | | |
|---|---|---|---|
| 2005/0034017 A1* | 2/2005 | Airaud | G06F 11/2242 714/25 |
| 2006/0176897 A1* | 8/2006 | Fields Jr. | G06F 15/7842 370/463 |
| 2008/0288683 A1* | 11/2008 | Ramey | G06F 13/4022 710/105 |
| 2014/0059250 A1* | 2/2014 | Suzuki | H04L 12/40 709/253 |
| 2015/0356049 A1* | 12/2015 | Bacha | G06F 1/3296 710/110 |
| 2019/0042489 A1* | 2/2019 | Nagabhushana | G06F 3/0613 |
| 2019/0303159 A1 | 10/2019 | Fryman et al. | |
| 2019/0363717 A1* | 11/2019 | Swarbrick | G06F 21/76 |
| 2020/0204657 A1* | 6/2020 | Khan | H04L 67/2842 |

\* cited by examiner

| DPE 114-08 | DPE 114-18 | DPE 114-28 | DPE 114-38 |
| --- | --- | --- | --- |
| DPE 114-07 | DPE 114-17 | DPE 114-27 | DPE 114-37 |
| DPE 114-06 | DPE 114-16 | DPE 114-26 | DPE 114-36 |
| DPE 114-05 | DPE 114-15 | DPE 114-25 | DPE 114-35 |
| DPE 114-04 | DPE 114-14 | DPE 114-24 | DPE 114-34 |
| DPE 114-03 | DPE 114-13 | DPE 114-23 | DPE 114-33 |
| DPE 114-02 | DPE 114-12 | DPE 114-22 | DPE 114-32 |
| DPE 114-01 | DPE 114-11 | DPE 114-21 | DPE 114-31 |
| TILE 118-00 | TILE 118-10 | TILE 118-20 | TILE 118-30 |

PROGRAMMABLE DEVICE HAVING A DATA PROCESSING ENGINE (DPE) ARRAY

TECHNICAL FIELD

This disclosure relates to a programmable device and, more particularly, to a programmable device having an array of data processing engines (DPEs).

BACKGROUND

A programmable integrated circuit (IC) refers to a type of IC that includes programmable circuitry. An example of a programmable IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs).

Circuit designs may be physically implemented within the programmable circuitry of a programmable IC by loading configuration data, sometimes referred to as a configuration bitstream, into the device. The configuration data may be loaded into internal configuration memory cells of the device. The collective states of the individual configuration memory cells determine the functionality of the programmable IC. For example, the particular operations performed by the various programmable circuit blocks and the connectivity between the programmable circuit blocks of the programmable IC are defined by the collective states of the configuration memory cells once loaded with the configuration data.

SUMMARY

Some examples described herein relate to programmable devices that include a data processing engine (DPE) array that permits shifting of where a user application, or portion thereof, is loaded onto DPEs of the DPE array from where the user application was mapped and routed on DPEs. Permitting shifting of where a user application (or portion) is loaded in the DPE array can permit for recovery of higher resource programmable devices that are implemented as lower resource programmable devices, which can increase yield of programmable devices and reduce costs of manufacturing.

In an example, a programmable device includes a DPE array. The DPE array includes DPEs and address index offset logic. Each of the DPEs includes a processor core and a memory mapped switch. The processor core is programmable via one or more memory mapped packets routed through the respective memory mapped switch. The memory mapped switches in the DPE array are coupled together to form a memory mapped interconnect network. The address index offset logic is configurable to selectively modify which DPE in the DPE array is targeted by a respective memory mapped packet routed in the memory mapped interconnect network.

An example is a method for operating a programmable device. An address index offset is written to address index offset logic in a data processing engine (DPE) array. The DPE array further includes DPEs, and each of the DPEs includes a processor core and a memory mapped switch. The memory mapped switches in the DPE array are coupled together to form a memory mapped interconnect network. For each of the DPEs, the processor core is programmable via one or more memory mapped packets routed through the respective memory mapped switch of the DPE. Each subset of different subsets of the DPEs is assigned a unique subset identification responsive to writing the address index offset. A memory mapped packet is routed in the memory mapped interconnect network based on the respective unique subset identification of each DPE in the DPE array that receives the memory mapped packet.

An example is a method for operating a programmable device. A packet including an original destination address and configuration data is received at an interface tile of a DPE array. The DPE array further includes DPEs. Each of the DPEs includes a processor core and a first memory mapped switch. The first memory mapped switches in the DPE array are coupled together to form a memory mapped interconnect network. For each of the DPEs, the processor core is programmable via one or more memory mapped packets routed through the respective first memory mapped switch of the DPE. At the interface tile, an address index offset is added to the original destination address to create a modified destination address. A memory mapped packet is routed in the memory mapped interconnect network based on the modified destination address. The memory mapped packet includes the configuration data and the modified destination address In an example, a programmable device includes a DPE array. The DPE array includes DPEs and address index offset logic. Each of the DPEs includes a processor core and a memory mapped switch. The processor core is programmable via one or more memory mapped packets routed through the memory mapped switch of the respective DPE. The memory mapped switches in the DPE array are coupled together to form a memory mapped interconnect network. The address index offset logic includes an address index offset register and serially connected adders. A first one of the serially connected adders has an input node connected to the address index offset register. Each of the serially connected adders has an input node connected to a logical "1" node to increment a value received on another input node of the respective adder. Each of the serially connected adders has an output node connected to a respective subset of the DPEs. Each of the serially connected adders being configured to output the incremented value as a unique subset identification to the respective subset of the DPEs. The address index offset logic being configured to provide the unique subset identifications responsive to an address index offset being written to the address index offset register. The memory mapped interconnect network is configured to route a respective memory mapped packet in the memory mapped interconnect network by comparing a destination address of the respective memory mapped packet to the unique subset identification of each DPE where the respective memory mapped packet is received. The memory mapped switch of each DPE in the DPE array being configured to compare a destination address of a received memory mapped packet to the unique subset identification of the respective DPE, when the destination address corresponds to the unique subset identification of the respective DPE, direct data of the memory mapped packet to a memory space internal to the respective DPE, and when the destination address does not correspond to the unique subset identification of the respective DPE, route the memory mapped packet to another DPE in another subset of the DPEs.

In an example, a programmable device includes a DPE array. The DPE array includes interface tiles and DPEs. Respective ones of the interface tiles include a first memory mapped switch, a configuration register, and address index offset logic. The address index offset logic includes an adder. The configuration register is writable via one or more memory mapped packets routed through the first memory mapped switch of the respective interface tile. The configuration register is configured to store an address index offset. Each of the DPEs includes a processor core and a second memory mapped switch. The processor core is programmable via one or more memory mapped packets routed through the second memory mapped switch of the respective DPE. The first memory mapped switches and the second memory mapped switches are coupled together to form a memory mapped interconnect network. For each of the respective ones of the interface tiles, the address index offset logic is connected between the first memory mapped switch of the respective interface tile and the second memory mapped switch of a neighboring one of the DPEs. For each of the respective ones of the interface tiles, the adder is configured to add the address index offset to an original destination address of a memory mapped packet received from the first memory mapped switch of the respective interface tile to obtain a modified destination address. For each of the respective ones of the interface tiles, the address index offset logic is configured to transmit the memory mapped packet to the second memory mapped switch of the neighboring one of the DPEs, and the address index offset logic is configured to selectively transmit the memory mapped packet including the original destination address or the modified destination address.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 6 through 9 depict various use cases relating to mapping and routing an application on a DPE array and loading the application on the DPE array according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
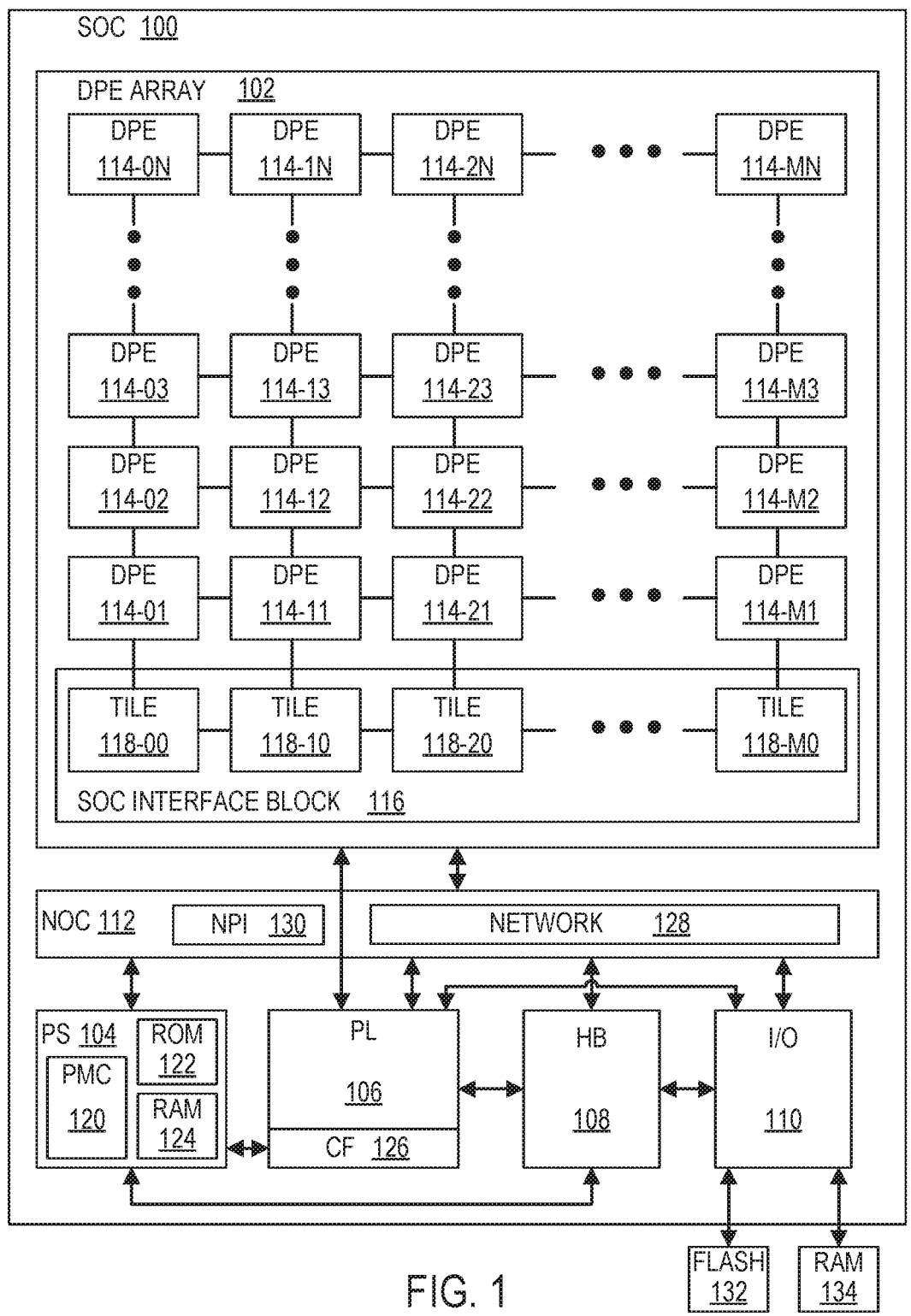
FIG. 1 depicts an architecture for a programmable device according to some examples.

Some examples described herein relate to programmable devices that include a data processing engine (DPE) array that permits shifting of where a user application, or portion thereof, is loaded onto DPEs of the DPE array from where the user application was mapped and routed on DPEs. Permitting shifting of where a user application (or portion) is loaded in the DPE array can permit for recovery of higher resource programmable devices that are implemented as lower resource programmable devices, which can increase yield of programmable devices and reduce costs of manufacturing.

More specifically, in some examples, a DPE array includes interface tiles and DPEs. The interface tiles can operate as an interface for the DPE array to one or more subsystems outside of the DPE array. Each of the DPEs can include programmable or configurable components, such as a hardened processor core. Each interface tile and DPE can include a memory mapped switch and a stream switch. The memory mapped switches are interconnected in a memory mapped interconnect network, and the stream switches are interconnected in a stream interconnect network. The stream switches can be configurable components within the respective interface tile or DPE. The configurable components within the interface tiles and DPEs are mapped to a memory space and can be programmed or configured using memory mapped packets routed in the memory mapped interconnect network. Memory mapped packets include respective destination addresses that indicate target interface tiles or DPEs, and the destination address is used to route the respective memory mapped packet in the memory mapped interconnect network to the target interface tile or DPE. For example, configuration data for implementing a user application on DPEs can be in memory mapped packets that are routed to the DPEs for loading that configuration data on the DPEs.

A programmable device that is manufactured to have a higher number of DPEs can include defective DPEs, and in such situations, that programmable device can be implemented as a programmable device with a lower number of DPEs. Some number of contiguous functional DPEs in the programmable device may permit the programmable device to be implemented as having the lower number of DPEs.

A user application mapped and routed for a programmable device having the lower number of DPEs can be loaded on the programmable device manufactured to have the higher number of DPEs and implemented as having the lower number of DPEs. The location of the number of contiguous functional DPEs in the DPE array of the programmable device can differ from a location of DPEs in a DPE array of a programmable device manufactured to have the lower number of DPEs. Which DPEs implementing the lower number of DPEs can be transparent so that a tool that generates a user application may not need to be aware of the defect and does not need to manually perform any remapping.

Some examples described herein provide for address index offset logic in the DPE array and/or in interface tiles that is capable of modifying addresses of DPEs and/or destination addresses of memory mapped packets that are used to target DPEs to load configuration data of the user application onto those DPEs. The modification of the addresses of DPEs and/or the destination addresses of the packets permits shifting where the user application is loaded within the DPE array, which enables recovery of programmable devices manufactured having a high number of DPEs and implemented as having a low number of DPEs.

Some examples described herein are described in the context of a heterogeneous data processing architecture of a programmable device. More specifically, for example, the architecture described below includes (i) programmable logic regions (e.g., fabric of an FPGA) that are capable of being configured to process data, (ii) a processing system, and (iii) DPEs, each with a core, that are also capable of being programmed to process data. Some examples can be extended to homogeneous data processing architectures, such as, for example, multi-core processors (e.g., without programmable logic regions). Such multi-core processors can have a large number of resources available for executing an application and can benefit from aspects of examples described herein.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed subject matter or as a limitation on the scope of the claimed subject matter. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Even further, various directions or orientations are described as, e.g., a column and a row; horizontal and vertical; bottom or below, top or above, left, and right; and east, west, north, and south. These designations are for ease of description, and other directions or orientations may be implemented.

FIG. 1 illustrates an architecture for a programmable device according to some examples. In these examples, the programmable device is a System-on-Chip (SoC) 100. The architecture is generally applicable to programmable devices having higher or lower numbers of resources (e.g., DPEs) as will become apparent. The architecture can be modified with any number of variations, some of which may be identified in the following description.

The SoC 100 includes a plurality of subsystems, including a DPE array 102, a processing system (PS) 104, programmable logic (PL) 106, hard block circuits (HB) 108, input/output circuits (I/O) 110, and a Network-on-Chip (NoC) 112. In some examples, each sub-system includes at least some component or circuit that is programmable, such as described herein. In some examples, some of the sub-systems can include a non-programmable application-specific circuit. Other circuits can be included in the SoC 100, such as other IP blocks like a system monitor or others.

The DPE array 102 includes a plurality of interconnected DPEs 114-01 through 114-MN (collectively or individually, DPE(s) 114). Each of the DPEs 114 is a hardened circuit block and may be programmable. Each of the DPEs 114 can include the architecture as illustrated in and described below with respect to FIG. 2. In the example of FIG. 1, the DPE array 102 includes a two-dimensional array of DPEs 114 and a SoC interface block 116. The DPE array 102 may be implemented using any of a variety of different architectures. FIG. 1 illustrates DPEs 114 arranged in aligned rows and aligned columns. The DPE array 102 has M+1 columns of DPEs 114 and N rows of DPEs 114. The reference numerals of the DPEs 114 in FIG. 1 indicate the positioning of each DPE 114 by the reference number "114-[column][row]." In some examples, DPEs 114 may be arranged where DPEs 114 in selected rows and/or columns are horizontally inverted or flipped relative to DPEs 114 in adjacent rows and/or columns. In other examples, rows and/or columns of DPEs 114 may be offset relative to adjacent rows and/or columns.

As described in more detail below, the DPEs 114 can communicate various data by different mechanisms within the DPE array 102. The DPEs 114 are connected to form a DPE interconnect network. To form the DPE interconnect network, each DPE 114 is connected to vertically neighboring DPE(s) 114 and horizontally neighboring DPE(s) 114. For example, DPE 114-12 is connected to vertically neighboring DPEs 114 within column 1, which are DPEs 114-11 and 114-13, and is connected to horizontally neighboring DPEs 114 within row 2, which are DPEs 114-02 and 114-22. DPEs 114 at a boundary of the DPE array 102 may be connected to fewer DPEs 114. The DPE interconnect network includes a stream interconnect network and a memory mapped interconnect network. The stream interconnect network includes interconnected stream switches, and application data and direct memory accesses (DMAs) may be communicated between the DPEs 114 via the stream interconnect network. The memory mapped interconnect network includes interconnected memory mapped switches, and configuration data can be communicated between the DPEs 114 via the memory mapped interconnect network. Neighboring DPEs 114 can further communicate via shared memory. An independent cascade stream can be implemented between DPEs 114.

The DPE array 102 further includes the SoC interface block 116 that includes tiles 118-00 through 118-MO (collectively or individually, tile(s) 118). Each of the tiles 118 of the SoC interface block 116 may be hardened and programmable. Each of the tiles 118 can include the architecture as illustrated in and described below with respect to FIG. 3A or 3B. The SoC interface block 116 provides an interface between DPEs 114 of DPE array 102 and other subsystems of the SoC 100, such as the NoC 112 and the PL 106.

In some examples, the SoC interface block 116 is coupled to adjacent DPEs 114. For example, as illustrated in FIG. 1, the SoC interface block 116 may be connected to each DPE 114 in the bottom row of DPEs 114-x1 in the DPE array 102 (where "x" indicates a given column). More particularly, in FIG. 1, each tile 118 of the SoC interface block 116 is connected to a neighboring DPE 114 within the column of the DPE array 102 in which the respective tile 118 is disposed. In FIG. 1, tile 118-00 is connected to DPE 114-01; tile 118-10 is connected to DPE 114-11; tile 118-20 is connected to DPE 114-21; etc. Additionally, each tile 118 is connected to neighboring tiles 118. The SoC interface block 116 is capable of communicating data through the tiles 118, e.g., of propagating data from tile 118-00 to tile 118-10, from tile 118-10 to tile 118-20, etc., and vice versa. A tile 118 within the SoC interface block 116 can communicate with a DPE 114 to which the tile 118 is connected, and the communication can be routed through the DPE interconnect network formed by the interconnected DPEs 114 to a target DPE 114.

Each tile 118 can service a subset of DPEs 114 in the DPE array 102. In the example of FIG. 1, each tile 118 services the column of DPEs 114 above the respective tile 118. The tiles 118 also include stream switches, which are interconnected in the stream interconnect network to stream switches of the DPEs 114, and memory mapped switches, which are interconnected in the memory mapped interconnect network to memory mapped switches of the DPEs 114. Communications from DPEs 114 can be communicated with the tile 118 below the respective DPEs 114 via the interconnected stream switches and/or memory mapped switches. The tile 118 can provide an interface to the PL 106 and/or the NoC 112 for communications therewith.

The PS 104 may be or include any of a variety of different processor types and number of processor cores. For example, the PS 104 may be implemented as an individual processor, e.g., a single core capable of executing program instruction code. In another example, the PS 104 may be implemented as a multi-core processor. The PS 104 may be implemented using any of a variety of different types of architectures. Example architectures that may be used to implement the PS 104 may include an ARM processor architecture, an x86 processor architecture, a graphics processing unit (GPU) architecture, a mobile processor architecture, a digital signal processor (DSP) architecture, or other suitable architecture that is capable of executing computer-readable program instruction code.

The PS 104 includes a platform management controller (PMC) 120, which may be a processor and/or processor core in the PS 104 capable of executing program instruction code. The PS 104 includes read-only memory (ROM) 122 (e.g., programmable ROM (PROM) such as eFuses, or any other ROM) and random access memory (RAM) 124 (e.g., static RAM (SRAM) or any other RAM). The ROM 122 stores program instruction code that the PMC 120 is capable of executing in a boot sequence. The ROM 122 further can store data that is used to configure the tiles 118. The RAM 124 is capable of being written to (e.g., to store program instruction code) by the PMC 120 executing program instruction code from the ROM 122 during the boot sequence, and the PMC 120 is capable of executing program instruction code stored in the RAM 124 during later operations of the boot sequence.

The PL 106 is logic circuitry that may be programmed to perform specified functions. As an example, the PL 106 may be implemented as fabric of an FPGA. The PL 106 can include programmable logic elements including configurable logic blocks (CLBs), look-up tables (LUTs), random access memory blocks (BRAM), Ultra RAMs (URAMs), input/output blocks (IOBs), digital signal processing blocks (DSPs), clock managers, and/or delay lock loops (DLLs). In some architectures, the PL 106 includes columns of programmable logic elements, where each column includes a single type of programmable logic element (e.g., a column of CLBs, a column of BRAMs, etc.). The programmable logic elements can have one or more associated programmable interconnect elements. For example, in some architectures, the PL 106 includes a column of programmable interconnect elements associated with and neighboring each column of programmable logic elements. In such examples, each programmable interconnect element is connected to an associated programmable logic element in a neighboring column and is connected to neighboring programmable interconnect elements within the same column and the neighboring columns. The interconnected programmable interconnect elements can form a global interconnect network within the PL 106.

The PL 106 has an associated configuration frame interconnect (CF) 126. A configuration frame node residing on the PMC 120 is connected to the CF 126. The PMC 120 sends configuration data to the configuration frame node, and the configuration frame node formats the configuration data in frames and transmits the frames through the CF 126 to the programmable logic elements and programmable interconnect elements. The configuration data may then be loaded into internal configuration memory cells of the programmable logic elements and programmable interconnect elements that define how the programmable elements are configured and operate. Any number of different sections or regions of PL 106 may be implemented in the SoC 100.

The HB 108 can be or include memory controllers (such as double data rate (DDR) memory controllers, high bandwidth memory (HBM) memory controllers, or the like), peripheral component interconnect express (PCIe) blocks, Ethernet cores (such as a 100 Gbps (C=100) media address controller (CMAC), a multi-rate MAC (MRMAC), or the like), forward error correction (FEC) blocks, Analog-to-Digital Converters (ADC), Digital-to-Analog Converters (DAC), and/or any other hardened circuit. The I/O 110 can be implemented as eXtreme Performance Input/Output (XPIO), multi-gigabit transceivers (MGTs), or any other input/output blocks. Any of the HB 108 and/or I/O 110 can be programmable.

The NoC 112 includes a programmable network 128 and a NoC peripheral interconnect (NPI) 130. The programmable network 128 communicatively couples subsystems and any other circuits of the SoC 100 together. The programmable network 128 includes NoC packet switches and interconnect lines connecting the NoC packet switches. Each NoC packet switch performs switching of NoC packets in the programmable network 128. The programmable network 128 has interface circuits at the edges of the programmable network 128. The interface circuits include NoC master units (NMUs) and NoC slave units (NSUs). Each NMU is an ingress circuit that connects a master circuit to the programmable network 128, and each NSU is an egress circuit that connects the programmable network 128 to a slave endpoint circuit. NMUs are communicatively coupled to NSUs via the NoC packet switches and interconnect lines of the programmable network 128. The NoC packet switches are connected to each other and to the NMUs and NSUs through the interconnect lines to implement a plurality of physical channels in the programmable network 128. The NoC packet switches, NMUs, and NSUs include register blocks that determine the operation of the respective NoC packet switch, NMU, or NSU.

A physical channel can also have one or more virtual channels. The virtual channels can implement weights to prioritize various communications along any physical channel. The NoC packet switches also support multiple virtual channels per physical channel. The programmable network 128 includes end-to-end Quality-of-Service (QoS) features for controlling data-flows therein. In examples, the programmable network 128 first separates data-flows into designated traffic classes. Data-flows in the same traffic class can either share or have independent virtual or physical transmission paths. The QoS scheme applies multiple levels of priority across traffic classes. Within and across traffic classes, the programmable network 128 applies a weighted arbitration scheme to shape the traffic flows and provide bandwidth and latency that meets the user requirements.

The NPI 130 includes circuitry to write to register blocks that determine the functionality of the NMUs, NSUs, and NoC packet switches. The NPI 130 includes a peripheral interconnect coupled to the register blocks for programming thereof to set functionality. The register blocks in the NMUs, NSUs, and NoC packet switches of the programmable network 128 support interrupts, QoS, error handling and reporting, transaction control, power management, and address mapping control. The NPI 130 includes an NPI root node residing on the PMC 120, interconnected NPI switches connected to the NPI root node, and protocol blocks connected to the interconnected NPI switches and a corresponding register block.

To write to register blocks, a master circuit, such as the PMC 120, sends configuration data to the NPI root node, and the NPI root node packetizes the configuration data into a memory mapped write request in a format implemented by the NPI 130. The NPI transmits the memory mapped write request to interconnected NPI switches, which route the request to a protocol block connected to the register block to which the request is directed. The protocol block can then translate the memory mapped write request into a format implemented by the register block and transmit the translated request to the register block for writing the configuration data to the register block.

The NPI 130 may be used to program any programmable boundary circuit of the SoC 100. For example, the NPI 130 may be used to program any HB 108 and/or I/O 110 that is programmable.

Various subsystems and circuits of the SoC 100 are communicatively coupled by various communication mechanisms. Some subsystems or circuits can be directly connected to others. As illustrated the I/O 110 is directly connected to the HB 108 and PL 106, and the HB 108 is further directly connected to the PL 106 and the PS 104. The PL 106 is directly connected to the DPE array 102. The DPE array 102, PS 104, PL 106, HB 108, and I/O 110 are communicatively coupled together via the programmable network 128 of the NoC 112.

The programmable device illustrated in FIG. 1 can be implemented in a single monolithic integrated circuit (IC) chip, or can be implemented distributed across multiple IC chips. When implemented in multiple IC chips, the IC chips can be stacked on each other, where neighboring chips are bonded (e.g., by hybrid oxide-to-oxide and metal-to-metal bonding) to each other or are attached to each other by external connectors (e.g., minibumps or microbumps). In other examples when implemented in multiple IC chips, the chips can be attached to a common substrate, such as an interposer or a package substrate. In some examples, one chip (e.g., a base chip) can include the PS 104, HB 108, I/O 110, and NoC 112, another one or more chips (e.g., fabric chips) can include the PL 106, and a further one or more chips (e.g., DPE chips) can include the DPE array 102. In a specific example, a chips stack includes a base chip, one or more fabric chips, and a DPE chip, where neighboring chips are bonded together by hybrid bonding, and the one or more fabric chips are disposed in the chip stack between the base chip and the DPE chip.

As will become apparent, DPEs 114 and tiles 118 may be programmed by loading configuration data into configuration registers that define operations of the DPEs 114 and tiles 118, by loading configuration data (e.g., program instruction code) into program memory for execution by the DPEs 114, and/or by loading application data into memory banks of the DPEs 114. The PMC 120 can transmit configuration data and/or application data via the programmable network 128 of the NoC 112 to one or more tiles 118 in the SoC interface block 116 of the DPE array 102. At each tile 118 that receives configuration data and/or application data, the configuration data and/or application data received from the programmable network 128 is converted into a memory mapped packet that is routed via the memory mapped interconnect network to a configuration register, program memory, and/or memory bank addressed by the memory mapped packet (and hence, to a target DPE 114 or tile 118). The configuration data and/or application data is written to the configuration register, program memory, and/or memory bank by the memory mapped packet.

Using a DPE array 102 as described herein in combination with one or more other subsystems provides heterogeneous processing capabilities of the SoC 100. The SoC 100 may have increased processing capabilities while keeping area usage and power consumption low. For example, the DPE array 102 may be used to hardware accelerate particular operations and/or to perform functions offloaded from one or more of the subsystems of the SoC 100. When used with a PS 104, for example, the DPE array 102 may be used as a hardware accelerator. The PS 104 may offload operations to be performed by the DPE array 102 or a portion thereof. In other examples, the DPE array 102 may be used to perform computationally resource intensive operations.

In some examples, the SoC 100 can be communicatively coupled to other components. As illustrated, the SoC 100 is communicatively coupled to flash memory 132 and to RAM 134 (e.g., DDR dynamic RAM (DDRDRAM)). The flash memory 132 and RAM 134 may be separate chips and located, e.g., on a same board (e.g., evaluation board) as the SoC 100. The flash memory 132 and the RAM 134 are communicatively coupled to the I/O 110, which is connected to HB 108 (e.g., one or more memory controllers). The HB 108 is connected to the PS 104 (e.g., the PMC 120). The PMC 120 is capable of reading data from the flash memory 132 via the HB 108 and I/O 110, and writing the read data to local RAM 124 and/or, via the HB 108 and I/O 110, to the RAM 134.

Figure 2:
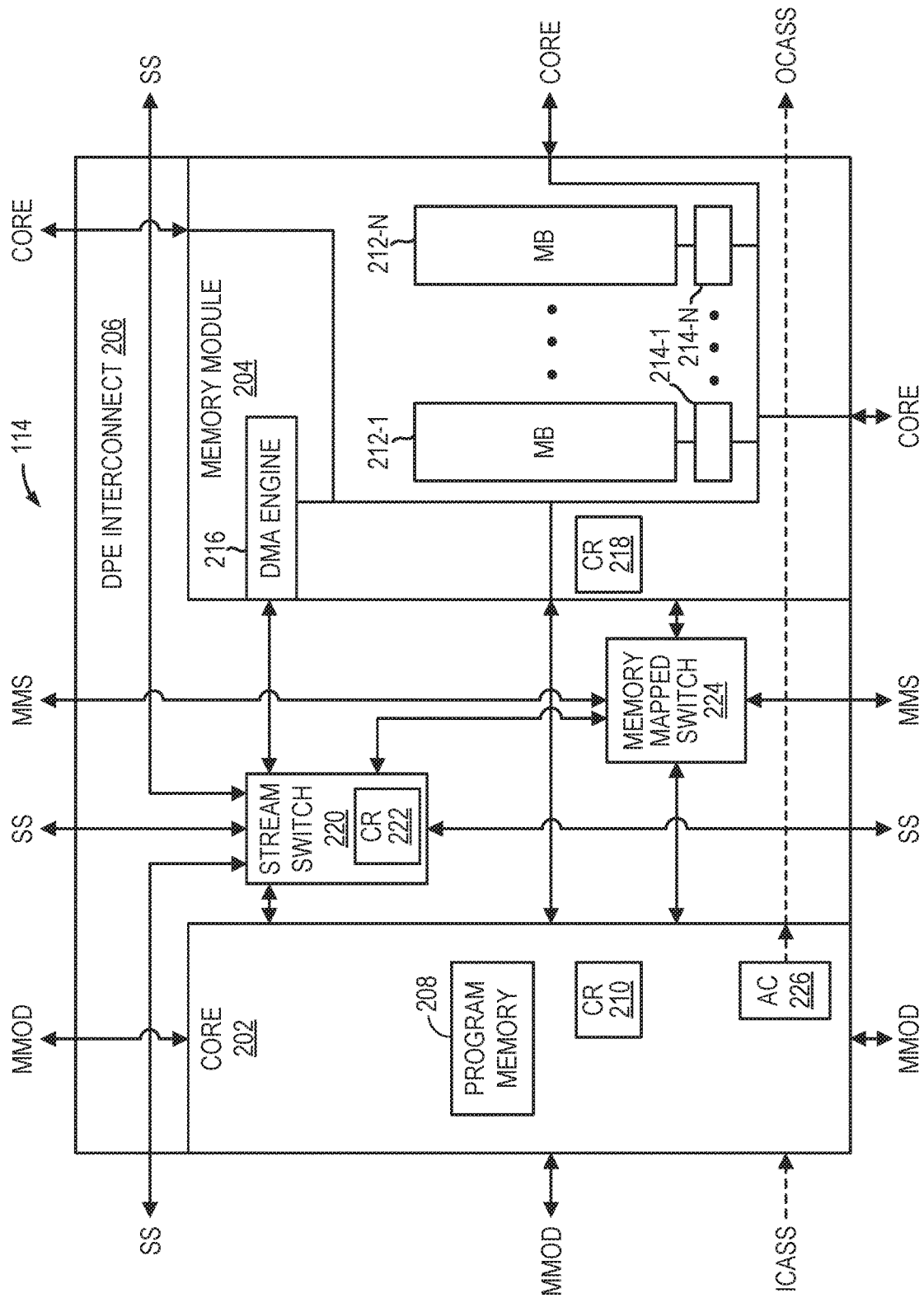
FIG. 2 depicts an architecture for a data processing engine (DPE) according to some examples.

FIG. 2 illustrates an architecture for a DPE 114 according to some examples. In the example of FIG. 2, DPE 114 includes a hardened processor core 202, a memory module 204, and DPE interconnect network 206.

The processor core 202 provides data processing capabilities of the DPE 114. The processor core 202 may be implemented as any of a variety of different processing circuits. In some examples, the processor core 202 is implemented as a processor that is capable of executing program instruction code, e.g., computer readable program instruction code. Program memory 208 is included in the processor core 202 and is capable of storing program instruction code that is executed by the processor core 202. The processor core 202, for example, may be implemented as a CPU, a GPU, a DSP, a vector processor, or another type of processor that is capable of executing program instruction code. The processor core 202 may include configuration registers (CR) 210 that may be loaded with configuration data to control operation of processor core 202. In some examples, the processor core 202 may be activated and/or deactivated based upon configuration data loaded into the configuration registers 210.

The memory module 204 includes memory banks 212-1 to 212-N. The memory banks 212-1 to 212-N are capable of storing data that may be read and consumed by one or more core and data (e.g., results) that may be written by one or more core. In some examples, each memory bank 212 is single-ported thereby allowing up to one access to each memory bank each clock cycle. In other examples, each memory bank 212 is dual-ported or multi-ported thereby allowing a larger number of parallel accesses each clock cycle. Each of memory banks 212-1 through 212-N has an arbiter 214-1 through 214-N. Each arbiter 214 may include arbitration logic. Further, each arbiter 214 may include a crossbar.

The memory module 204 further includes DMA engine 216. In some examples, DMA engine 216 is capable of (i) receiving input data streams from the DPE interconnect network 206 and writing the received data to memory banks 212, and (ii) reading data from memory banks 212 and sending the data out via the DPE interconnect network 206, as described below. Through DMA engine 216, application data may be received from other sources (e.g., other subsystems or any DPE 114) within the SoC 100 and stored in the memory module 204. Through DMA engine 216, data may be read from the memory banks 212 of memory module 204 and sent to other destinations (e.g., other subsystems or any DPE 114). The memory module 204 may include configuration registers (CR) 218 that may be loaded with configuration data to control operation of the memory module 204. More specifically, the DMA engine 216 may be controlled by the configuration registers 218.

The DPE interconnect network 206 in the DPE 114 facilitates communication with one or more other DPEs and/or with other subsystems of the SoC 100. The DPE interconnect network 206 further enables communication of configuration data with the DPE 114. In some examples, the DPE interconnect network 206 is implemented as an on-chip interconnect, such as an Advanced Microcontroller Bus Architecture (AMBA) eXtensible Interface (AXI) bus (e.g., or switch) and/or other interconnect circuitry.

The DPE interconnect network 206 includes a stream interconnect network and a memory mapped interconnect network. The stream interconnect network is capable of exchanging data (e.g., application data) with other DPEs of DPE array 102 and/or other subsystems of the SoC 100. The memory mapped interconnect network is capable of exchanging data such as configuration data for the DPE(s).

The stream interconnect network of DPE interconnect network 206 includes a stream switch 220 in each DPE 114, and stream switches 220 of DPEs are interconnected in forming the stream interconnect network. The stream switch 220 is used to communicate with other DPEs and/or the SoC interface block 116. For example, the stream switch 220 can communicate with a stream switch (SS) in a DPE 114 or tile 118 in the SoC interface block 116 in each cardinal direction—e.g., to the left, above, right, and below. The stream switch 220 is capable of allowing non-neighboring DPEs to communicate with the core 202 and/or the memory module 204 via the stream interconnect network. The stream switch 220 can communicate with the core 202 and the memory module 204. The core 202 can therefore communicate with other DPEs 114 via the stream switch 220. The stream switch 220 can also communicate with the DMA engine 216 of the memory module 204, which permits other DPEs 114 to communicate with the DMA engine 216. Cores of other DPEs may directly access the memory banks 212 of the memory module via the stream switch 220 (and stream interconnect network) and the DMA engine 216. The stream switch 220 may include configuration registers (CR) 222 to which configuration data may be written that can dictate which other DPEs and/or subsystems (e.g., the PL 106 and/or the PS 104) the DPE 114 can communicate with via the stream switch 220 and can dictate operation of the stream switch 220 (e.g., establishing circuit-switched point-to-point connections or packet-switched connections).

The memory mapped interconnect network of DPE interconnect network 206 includes a memory mapped switch 224 in each DPE 114, and memory mapped switches 224 of DPEs are interconnected in forming the memory mapped interconnect network. The memory mapped switch 224 is used to exchange configuration data for the DPE 114. The memory mapped switch 224 is capable of receiving configuration data that is used to configure the DPE 114. The memory mapped switch 224 may receive configuration data from a memory mapped switch (MMS) of a DPE and/or a tile 118 located below DPE 114. The memory mapped switch 224 is capable of forwarding received configuration data to a memory mapped switch (MMS) of another DPE above DPE 114, to program memory 208 and/or configuration registers 210 within the core 202, to memory banks 212 and/or configuration registers 218 in the memory module 204, and/or to configuration registers 222 within the stream switch 220. Each memory mapped switch 224 is assigned a row identification. Examples of how row identifications are assigned are described below. In the illustrated architecture, each memory mapped switch 224 is configured to route a memory mapped packet north to a memory mapped switch of the DPE above when the row identification within the memory mapped packet does not match the row identification assigned to the memory mapped switch 224, and is configured to route configuration data to a memory space internal to the DPE 114 when the row identification within the memory mapped packet matches the row identification assigned to the memory mapped switch 224.

In some examples, the DPE array 102 is mapped to the address space of the PS 104. Accordingly, any configuration registers and/or memories within any DPE 114 may be accessed via the memory mapped interconnect network. For example, the program memory 208, the memory banks 212, and configuration registers 210, 218, 222 may be read and/or written via the memory mapped switch 224. Through the memory mapped interconnect network, subsystems of the SoC 100 are capable of reading an internal state of any configuration register 210, 218, 222, and are capable of writing configuration data to any configuration register 210, 218, 222. Through the memory mapped interconnect network, subsystems of the SoC 100 are capable of reading the program memory 208, and are capable of writing program instruction code to the program memory 208. Through the memory mapped interconnect network, subsystems of the SoC 100 are capable of reading data from and writing data to the memory bank 212 via the arbiters 214.

The memory module 204 is capable of communicating with a core (CORE) of a DPE 114 neighboring the memory module 204, and hence, is capable of operating as a shared memory that may be accessed by multiple DPEs. In the orientation of the example of FIG. 2, cores 202 of the illustrated DPE 114 and DPEs 114 above, to the right, and below the illustrated DPE 114 (e.g., cores that share a boundary with the memory module 204) can access the memory banks 212 through arbiters 214. Accordingly, in the example of FIG. 2, each core 202 or DPE 114 that has a shared boundary with the memory module 204 is capable of reading and writing to memory banks 212. If the orientation of the DPE 114 differs, orientations of cores that are capable of accessing the memory module 204 can differ.

The core 202 is capable of communicating with a memory module (MMOD) neighboring the core 202, and hence, is capable of accessing memory modules of other neighboring DPEs. In the orientation of the example of FIG. 2, the core 202 of the illustrated DPE 114 can access the memory modules of the illustrated DPE 114 and DPEs 114 above, to the left, and below the illustrated DPE 114 (e.g., memory modules that share a boundary with the core 202). Accordingly, in the example of FIG. 2, the core 202 is capable of reading and writing to any of the memory modules of DPEs that share a boundary with the core 202. The core 202 is capable of directing the read and/or write requests to the appropriate memory module based upon the addresses that are generated. If the orientation of the DPE 114 differs, orientations of memory modules that are capable of being accessed the core 202 can differ.

The core 202 may also include cascade interfaces, each of which is capable of providing direct communication with another core. The core 202 receives an input data stream (ICASS) directly from the core of the DPE to the left of the illustrated DPE 114. The received data stream may be provided to the data processing circuitry within core 202. The core 202 is capable of sending an output data stream (OCASS) directly to the core of the DPE to the right of the illustrated DPE 114. Each cascade interface may include a first-in-first-out (FIFO) interface for buffering. A cascade interface is capable of outputting to another core the contents of an accumulator register (AC) 226 in the core 202 and may do so each clock cycle. Accumulator register 226 may store data that is generated and/or being operated upon by data processing circuitry within core 202. The cascade interfaces may be programmed based upon configuration data loaded into the configuration registers 210 (e.g., activated or deactivated). In some other examples, the cascade interfaces are controlled by the core 202. For example, the core 202 may include program instruction code to read/write to the cascade interface(s).

Figure 3A:
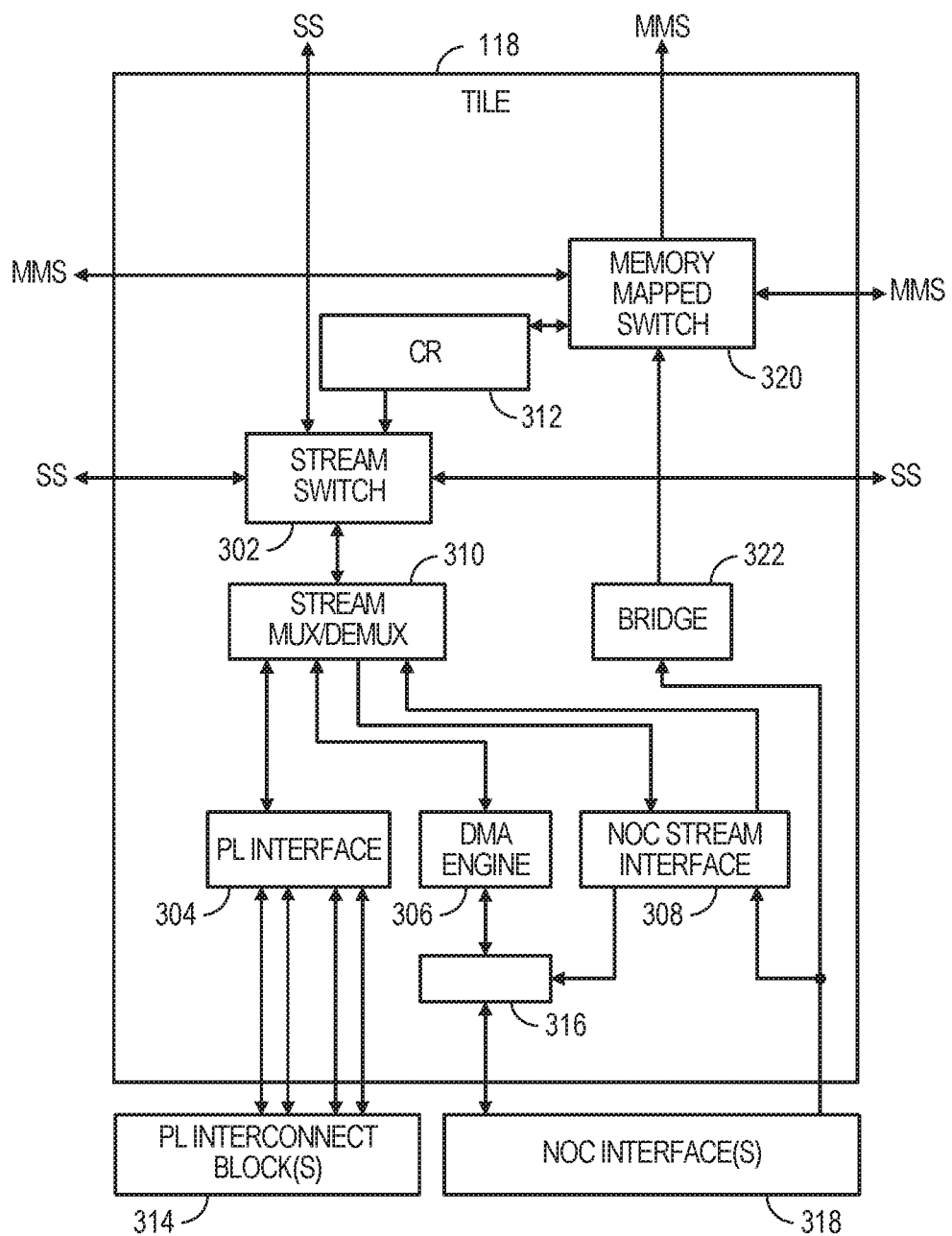
FIGS. 3A and 3B depict architectures for a tile of a SoC interface block according to some examples.
Figure 3B:
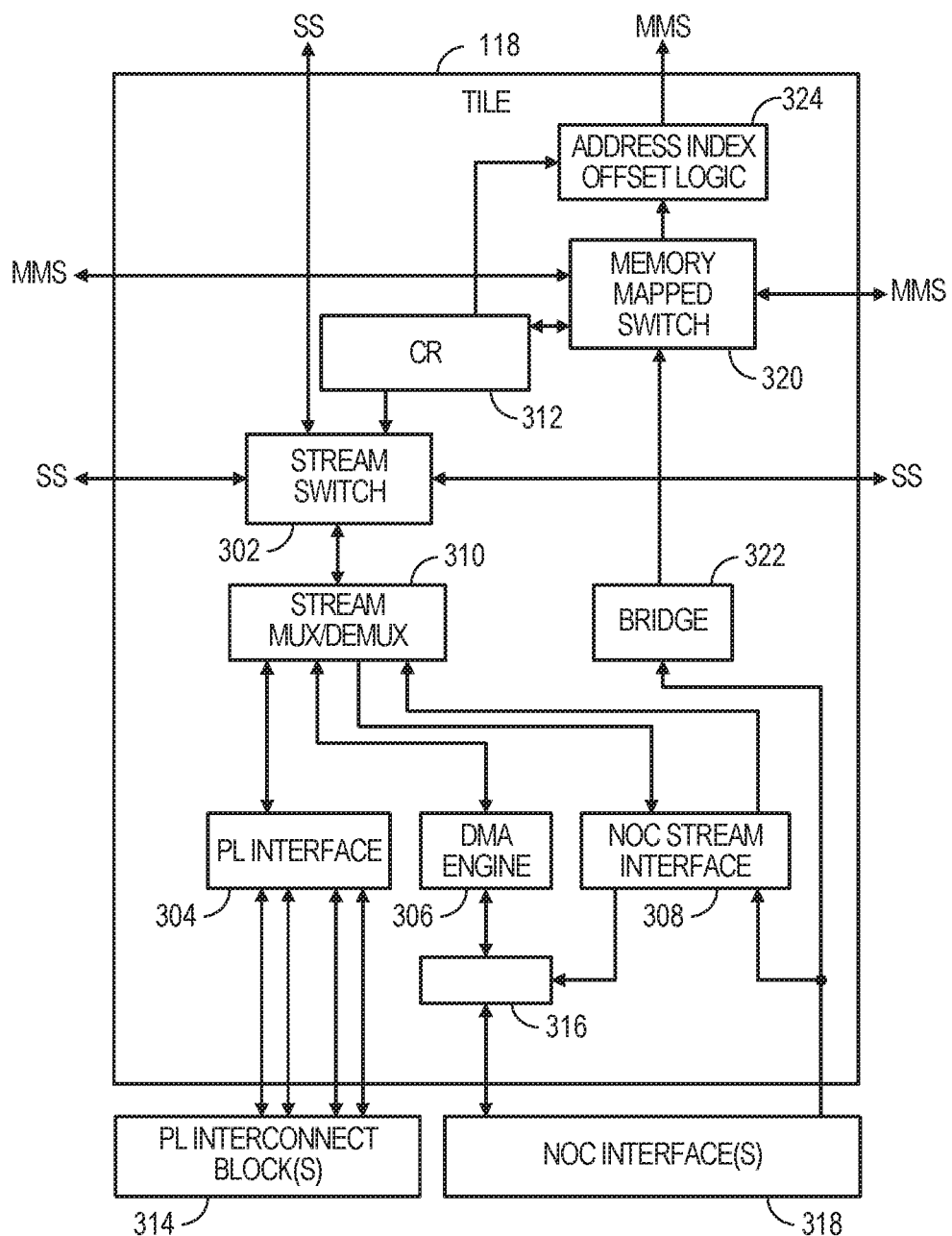

FIGS. 3A and 3B illustrate architectures for a tile 118 of the SoC interface block 116 according to some examples. In other implementations of a tile 118, a tile 118 may include additional or less circuitry and/or functionality. The tile 118 includes a stream switch 302. Stream switch 302 is connected horizontally to respective stream switches (SS) in neighboring tiles 118 and vertically to a stream switch (SS) in a neighboring DPE 114 to connect to and further form the stream interconnect network of the DPE array 102. Stream switches in neighboring tiles 118 are capable of exchanging data horizontally. The stream switch 302 is capable of communicating with the DPE 114 immediately above the tile 118. The stream switch 302 is also connected to and may communicate with a PL interface 304, a DMA engine 306, and/or a NoC stream interface 308 via a stream multiplexer/demultiplexer ("stream mux/demux") 310.

The stream switch 302 is configurable by configuration data loaded into configuration registers 312. The stream switch 302, for example, may be configured to support packet-switched and/or circuit-switched operation based upon the configuration data. Further, the configuration data defines the particular DPE and/or DPEs within DPE array 102 to which stream switch 302 communicates.

The stream multiplexer/demultiplexer 310 is capable of directing data received from the PL interface 304, DMA engine 306, and/or NoC stream interface 308 to the stream switch 302. Similarly, the stream multiplexer/demultiplexer 310 is capable of directing data received from the stream switch 302 to the PL interface 304, DMA engine 306, and/or to NoC stream interface 308. The stream multiplexer/demultiplexer 310 may be programmed by configuration data stored in the configuration registers 312 to route selected data to the PL interface 304, to the DMA engine 306 where such data is sent over the programmable network 128 of the NoC 112 as memory mapped packets, and/or to the NoC stream interface 308 where the data is sent over the programmable network 128 of the NoC 112 as a data stream.

The PL interface 304 couples to the PL 106 of the SoC 100 and provides an interface thereto. The PL interface 304 couples directly to one or more programmable interconnect elements and/or boundary logic interfaces (BLIs) (e.g., generically, one or more PL interconnect blocks 314) in the PL 106. In some examples, the PL interface 304 is further coupled to other types of circuit blocks and/or subsystems to be capable of transferring data between tile 118 and such other subsystems and/or blocks.

The DMA engine 306 is capable of operating to direct data into the programmable network 128 of the NoC 112 through a selector block 316 and on to an NMU and/or NSU (e.g., generically, a NoC interface(s) 318). The DMA engine 306 is capable of receiving data from DPEs (via the stream interconnect network) and providing such data to the programmable network 128 of the NoC 112 as memory mapped packets.

In some examples, the DMA engine 306 is capable of accessing an external memory. For example, DMA engine 306 is capable of receiving data streams from DPEs and sending the data stream to external memory through the programmable network 128 of the NoC 112 to a memory controller located within the SoC 100. The memory controller then directs the data received as data streams to the external memory (e.g., initiates reads and/or writes of the external memory as requested by DMA engine 306). Similarly, DMA engine 306 is capable of receiving data from external memory where the data may be distributed to other tile(s) 118 of SoC interface block 116 and/or up into target DPEs 114.

The NoC stream interface 308 is capable of receiving data from the programmable network 128 of the NoC 112 via the NoC interface(s) 318 and forwarding the data to the stream multiplexer/demultiplexer 310. The NoC stream interface 308 is further capable of receiving data from stream multiplexer/demultiplexer 310 and forwarding the data to NoC interface 318 through the selector block 316. The selector block 316 is configurable to pass data from the DMA engine 306 or from NoC stream interface 308 on to NoC interface (s) 318.

The tile 118 includes a memory mapped switch 320. Referring to FIG. 3A, in some examples, the memory mapped switch 320 connects vertically to the memory mapped switch (MMS) of the DPE immediately above. Coupling the memory mapped switch 320 to the memory mapped switch 224 of the above DPE 114 permits, for example, the memory mapped switch 320 to be capable of communicating with the column of DPEs 114 above the tile 118 and to further form the memory mapped interconnect network of the DPE array 102. The memory mapped switch 320 connects horizontally to memory mapped switches (MMS) in neighboring tiles 118, which permits, for example, the memory mapped switch 320 to be capable of moving data (e.g., configuration data) from one tile to another to reach a target column of DPEs 114 and direct the data to the target DPE 114 within the column. The memory mapped switch 320 may also connect to configuration registers 312 within tile 118. Through memory mapped switch 320, configuration data may be loaded into configuration registers 312 to control various functions and operations performed by components within tile 118. The memory mapped switch 320 is coupled to NoC interface(s) 318 via bridge 322. The bridge 322 is capable of converting memory mapped data transfers from the programmable network 128 of the NoC 112 (e.g., configuration data) into memory mapped packets that may be received by memory mapped switch 320.

Referring to FIG. 3B, in some examples, the memory mapped switch 320 connects vertically to address index offset logic 324. The address index offset logic 324 connects vertically to the memory mapped switch (MMS) of the DPE immediately above. Coupling the memory mapped switch 320 to the memory mapped switch 224 of the above DPE 114 permits, for example, the memory mapped switch 320 to be capable of communicating with the column of DPEs 114 above the tile 118 and to further form the memory mapped interconnect network of the DPE array 102. The memory mapped switch 320 connects horizontally to memory mapped switches (MMS) in neighboring tiles 118, which permits, for example, the memory mapped switch 320 to be capable of moving data (e.g., configuration data) from one tile to another to reach a target column of DPEs 114 and direct the data to the target DPE 114 within the column. The memory mapped switch 320 may also connect to configuration registers 312 within tile 118. Through memory mapped switch 320, configuration data may be loaded into configuration registers 312 to control various functions and operations performed by components within tile 118. The memory mapped switch 320 is coupled to NoC interface(s) 318 via bridge 322. The bridge 322 is capable of converting memory mapped data transfers from the programmable network 128 of the NoC 112 (e.g., configuration data) into memory mapped packets that may be received by memory mapped switch 320. The address index offset logic 324 can include an adder circuit that is configured to add an address index offset to a destination address of a memory mapped packet received from the memory mapped switch 320. The address index offset can be written to the configuration registers 312. Additionally, an enable for the address index offset logic 324 can be written to the configuration registers 312 to selectively enable the address index offset logic 324.

Some tiles 118 can omit connections to NoC interface(s) 318, and hence, can omit the stream mux/demux 310 (e.g., with a direct connection between the stream switch 302 and the PL interface 304), DMA engine 306, NoC stream interface 308, selector block 316, bridge 322, and address index offset logic 324. The PS 104 or any other subsystem or circuit block can communicate with, e.g., a core 202 or memory module 204 of any DPE 114 via the memory mapped interconnect network of the DPE array 102.

Figure 4:
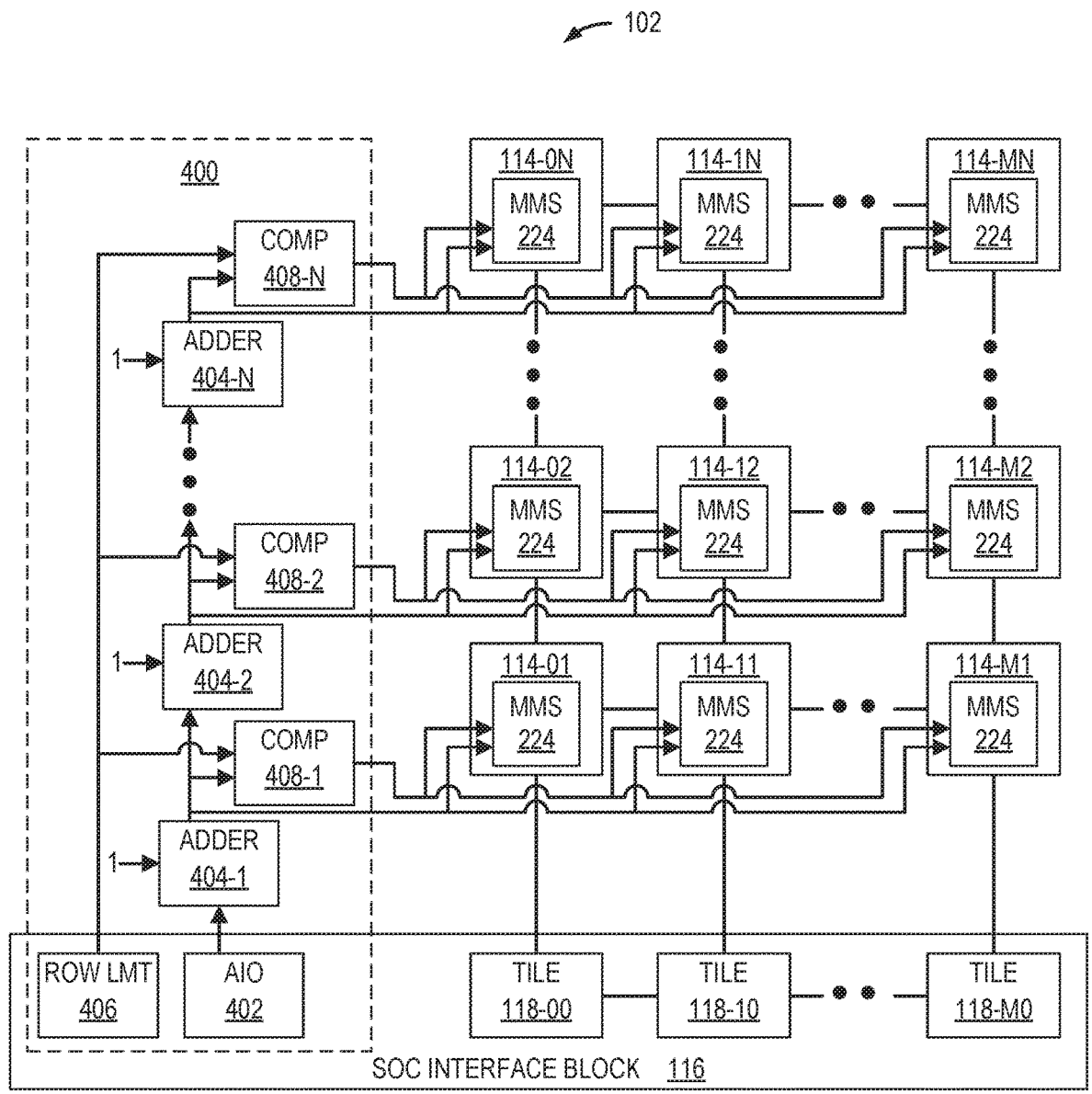
FIG. 4 depicts further aspects of an architecture for the DPE array according to some examples.

FIG. 4 illustrates further aspects of an architecture for the DPE array 102 according to some examples. The DPE array 102 further includes address index offset logic 400. The address index offset logic 400 includes address index offset (AIO) register 402, adders 404-1, 404-2, ... 404-N, a row limit register 406, and comparators 408-1, 408-2, ... 408-N. The AIO register 402 and row limit register 406 are illustrated disposed within the SoC interface block 116, and in other examples, can be disposed outside of the SoC interface block 116. In some examples, the AIO register 402 and row limit register 406 can be part of configuration registers 312 of, e.g., the tile 118-00 or another tile 118. An address index offset can be written to the AIO register 402, and a row limit (e.g., a top row or a bottom row depending on implementation) can be written to the row limit register 406. In some examples, the AIO register 402 and row limit register 406 can be written by memory mapped packets via a memory mapped switch 320 of a tile 118 (e.g., via a memory mapped switch 320 of tile 118-00 when the AIO register 402 and row limit register 406 are part of configuration registers 312 of the tile 118-00). In some examples, the AIO register 402 and row limit register 406 can be written by memory mapped write requests via the NPI 130.

Each adder 404 and each comparator 408 are associated with, generally, a respective subset of DPEs 114, and more specifically in the illustrated architecture, a respective row of the DPEs 114. Adder 404-1 and comparator 408-1 are associated with the row formed by DPEs 114-x1. Adder 404-2 and comparator 408-2 are associated with the row formed by DPEs 114-x2. Adder 404-N and comparator 408-N are associated with the row formed by DPEs 114-xN. Although various reference to rows of DPEs 114 are made below with respect to example implementations, a subset can differ in other example architectures. For example, a subset can be a column in some architectures.

As illustrated, the adders 404 are serially connected and are configured to increment a value input to the respective adder 404 and output the respective incremented value. The AIO register 402 has bits connected to respective input nodes of the adder 404-1. Another input node of the adder 404-1 is a logical "1" node (e.g., connected to a positive power supply node). Output nodes of the adder 404-1 are connected to input nodes of memory mapped switches 224 of respective DPEs 114-x1, to input nodes of the comparator 408-1, and to input nodes of the adder 404-2. Another input node of the adder 404-2 is a logical "1" node. Output nodes of the adder 404-2 are connected to input nodes of memory mapped switches 224 of respective DPEs 114-x2, to input nodes of the comparator 408-2, and to input nodes of an adder associated with a subsequent row of DPEs. This pattern continues through to the adder 404-N, where output nodes of the adder 404-N are connected to input nodes of memory mapped switches 224 of respective DPEs 114-xN and to input nodes of the comparator 408-N.

As illustrated, the row limit register 406 has bits connected to respective input nodes of the comparators 408-1, 408-2, ... 408-N. An output node of the each comparator 408 is connected to input nodes of memory mapped switches 224 of DPEs 114 along the row of DPEs 114 associated with that comparator 408. An output node of the comparator 408-1 is connected to input nodes of memory mapped switches 224 of respective DPEs 114-x1. An output node of the comparator 408-2 is connected to input nodes of memory mapped switches 224 of respective DPEs 114-x2. An output node of the comparator 408-N is connected to input nodes of memory mapped switches 224 of respective DPEs 114-xN.

An address index offset written to the AIO register 402 can be sequentially incremented at each row of DPEs 114 by the adder 404 associated with the row. The resulting values from the adders 404 are corresponding values of row identification bits. The values of row identification bits for a row of DPEs are propagated to each memory mapped switch 224 in the row, which assigns the row identification to the DPEs. The values of row identification bits received at a memory mapped switch 224 in a DPE 114 designate the row identification of that DPE 114. Additional details of this operation are described subsequently.

Depending on an implementation, the adder 404-1 can be omitted, and the AIO register 402 can have bits connected to respective input nodes of memory mapped switches 224 of respective DPEs 114-x1, to input nodes of the comparator 408-1, and to input nodes of the adder 404-2. For example, assuming that a zero address index offset is to be implemented, a zero can be written to the AIO register 402. In such circumstances, for example, if the row of DPEs 114-x1 is to have a row identification of zero, the adder 404-1 can be omitted. In other examples, assuming that a zero address index offset is to be implemented, a zero can be written to the AIO register 402. In such circumstances, for example, if the row of DPEs 114-x1 is to have a row identification of one, the adder 404-1 can be included. A person having ordinary skill in the art will readily envision other modifications for different implementations, such as if a negative one is to be written to the A10 register 402 to implement no address index offset).

A row limit written to the row limit register 406 can be used to determine a permissible range of rows that memory mapped packets can target. The row limit can indicate a row identification (e.g., including accommodating the address index offset) that is an end of range of the DPEs 114 that can be targeted by memory mapped packets. Each comparator 408 compares the row limit to the row identification output by the adder 404 associated with the row of DPEs 114 with which the comparator 408 is associated. Each comparator 408 can be or include bitwise exclusive NOR gates without output nodes connected to respective input nodes of an AND gate, for example. When the row limit matches the row identification output by the corresponding adder 404, the comparator 408 asserts an end-of-range signal to the memory mapped switches 224 of the associated row of DPEs 114; otherwise, the end-of-range signal is not asserted. The memory mapped switches 224 can use the end-of-range signal as an error detection mechanism. For example, if a memory mapped switch 224 receives an asserted end-of range signal and receives a memory mapped packet having a row identification larger than the row identification received from the corresponding adder 404 of associated with that row, the memory mapped switch 224 can determine that the memory mapped packet targets an out of range DPE 114 and can report an error, e.g., to the PMC 120.

In some examples, the row limit register 406 and comparators 408 can be omitted. In other examples, various comparators 408 can be included while others are omitted. Depending on the architecture of the DPE array 102 and how user applications are instantiated in the DPE array 102, some comparators 408 may be unnecessary. For example, comparator 408-N may be omitted as unnecessary since row of DPEs 114-xN is a last row (e.g., having a highest row identification) such that the output node of the comparator 408-N can instead be a logical "1" node.

Figure 5:
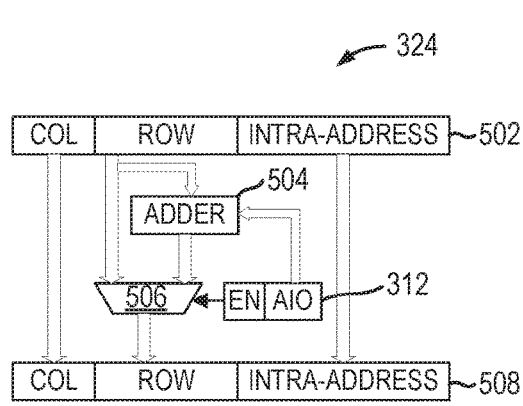
FIG. 5 depicts a circuit schematic of address index offset logic according to some examples.

FIG. 5 illustrates a circuit schematic of address index offset logic 324 according to some examples. The address index offset logic 324 includes input memory 502, an adder 504, a multiplexer 506, and output memory 508. Each of the input memory 502 and output memory 508 can be a register, a cache, a buffer, or the like. The input memory 502 receives and at least temporarily stores an original destination address of a received memory mapped packet. A format of the original destination address includes column bits of a column identification of the target DPE 114 or tile 118, row bits of a row identification of the target DPE 114 or tile 118, and intra-address bits of an address indicating a memory address space within the target DPE 114 or tile 118. Additional examples and detail of such a format is described below. Bits of the input memory 502 where the column bits and intra-address bits are stored are connected to the column bits and intra-address bits of the output memory 508. In some examples, column bits and column identification can be stripped from the original address since propagating the memory mapped packet between columns to a target column occurs before reaching the address index offset logic 324. Bits of the input memory 502 where row bits are stored are connected to respective inputs of the adder 504 and the multiplexer 506. Bits where the address index offset (A10) is stored in the configuration register 312 are connected to an input of the adder 504. Output bits of the adder 504 are connected to the multiplexer 506. A bit where the enable signal (EN) is stored in the configuration register 312 is connected to a control node of the multiplexer 506. Output bits from the multiplexer 506 are connected to row bits of the output memory 508.

The original destination address is stored in the input memory 502. The column (if implemented) and intra-address bits of the original destination address are passed to and stored in respective column and intra-address bits of the output memory 508. The row bits of the original destination address are passed to the adder 504 and the multiplexer 506. The address index offset is transmitted from the configuration register 312 to the adder 504. The adder 504 adds the address index offset to the row bits and outputs the result to the multiplexer 506. The enable signal stored in the configuration register 312 causes the multiplexer 506 to selectively output the row bits from the input memory 502 or the result from the adder 504 to the row bits of the output memory 508. Hence, the value of the row bits of the output memory 508 can selectively be (i) the value of the row bits of the original destination address or (ii) the result of the addition of the value of the row bits of the original destination address to the address index offset. The multiplexer 506 permits bypassing the adder 504 based on the enable signal. The multiplexer 506 may be a bypass circuit, although other bypass circuits may be implemented. When the multiplexer 506 is configured to bypass the adder 504, the output destination address is the input destination address. When the multiplexer 506 is configured to not bypass the adder 504, the output destination address is a modification of the input destination address (e.g., the modified value of the row bits in the output destination address is the value of the row bits of the input destination address plus the address index offset). The memory mapped packet having the destination address in the output memory 508 is then transmitted from the address index offset logic 324.

The circuit schematic of FIG. 5 is provided as an example. Other circuits can be implemented as the address index offset logic. For example, the multiplexer 506 and enable signal can be omitted. In such circumstances, bits of the input memory 502 where row bits are stored are connected to respective inputs of the adder 504, and output bits of the adder 504 are connected to row bits of the output memory 508. A zero value can be written as the address index offset in the configuration register 312 when an address index offset is to be not implemented, and hence, the input destination address can be passed as the output destination address.

Different examples implement different architectures and circuit schematics described above. In some examples, the architecture illustrated by FIGS. 1, 2, 3A, and 4 is implemented. In such examples, an address index offset is implemented to modify row identifications of DPEs 114. For convenience below, such examples are referred to as "DPE-based address index modification" or similar terminology. In some examples, the architecture illustrated by FIGS. 1, 2, 3B, and 5 is implemented. In such examples, an address index offset is implemented to modify row identifications within memory mapped packets. For convenience below, such examples are referred to as "packet-based address index modification" or similar terminology. It is noted that various examples can include aspects of other described examples. For example, architectures implementing packet-based address index modification can include the adders 404, row limit register 406, and comparators 408, such as where an input of the adder 404-1 (or adder 404-2 depending on implementation) is connected to a logical "0" node (e.g., a negative power supply node, such as a ground node) rather than an AIO register.

Operations of these DPE-based address index modification and packet-based address index modification examples are described. A boot sequence can establish an initial or default configuration of the DPE array 102. As part of the boot sequence, the configuration registers 210, 218, 222, 312 are reset to disable functionality that is configured to be selectively enabled. For example, the core 202 of each DPE 114 is disabled by resetting one or more bits of the configuration registers 210. Additionally, resetting the configuration registers 222, 312 includes causing each of the stream switches 220, 302 to be configured in a pass-through mode. The pass-through mode can be a circuit switching mode where each input port is connected to a corresponding output port to pass a data stream through the stream switch 220, 302 without any re-direction or routing. For example for each stream switch 220, 302, each east input port is connected to a corresponding west output port; each west input port is connected to a corresponding east output port; each north input port is connected to a corresponding south output port; and each south input port is connected to a corresponding north output port.

Further, in DPE-based address index modification examples, the AIO register 402 can be written to have a zero (e.g., all bits of the AIO register 402 are written as zero), and the row limit register 406 can be written to have a maximum value (e.g., all bits of the row limit register 406 are written as one). In packet-based address index modification examples, the configuration registers 312 are reset to disable the address index offset logic 324 of each tile 118 that includes address index offset logic 324. Disabling the address index offset logic 324 can be implemented by resetting an enable signal bit in a configuration register 312 and/or by resetting bits to which an address index offset is written in the configuration registers 312 to zero.

Each memory mapped switch 224, 320 undergoes an auto-discovery process to determine memory address spaces in the DPE array 102 and to populate routing tables within the memory mapped switch 224, 320. The initial or default configuration can be established by hardened logic (e.g., a state machine) and/or by the PMC 120 executing program code instructions stored in ROM 122. Other operations may be included. Included in this process may be that the memory mapped switches 224 of DPEs 114 are provided or assigned respective row identifications. In DPE-based address index modification examples, the AIO register 402 is initially set to a default value (e.g., zero), and row identifications are propagated from the adders 404 and to corresponding memory mapped switches 224. For example, when the default value is zero, a row identification of 1 is propagated to memory mapped switches 224 of DPEs 114-x1; a row identification of 2 is propagated to memory mapped switches 224 of DPEs 114-x2; etc. As indicated subsequently, these row identifications can be modified by writing a different value to the AIO register 402. In packet-based address index modification examples, where the AIO register 402 is omitted, the adder 404-1 can have input nodes (that are connected to the AIO register 402 in DPE-based address index modification examples) connected to a logical zero (e.g., a negative power supply node, such as a ground node), which can similarly cause row identifications to be propagated through the adders 404 and to corresponding memory mapped switches 224. In such examples, the row identifications can be hardened and not reconfigurable.

Subsequently, while the PMC 120 executes program code instructions stored in ROM 122 as part of the boot sequence, the PMC 120 reads data written to the ROM 122 that is indicative of the address index offset and, if implemented, the row limit. The ROM 122 to which the data is written can be eFuses, for example, that are written after testing the SoC 100 and/or by downloading the data from a database as part of a one-time registration process. In some examples, the PMC 120 can perform a self-test as part of a power up sequence, which can determine and obtain data that is indicative of the address index offset. Details of the data that is written to the ROM 122 and/or obtained by a self-test or other mechanism are described below. The data can be the address index offset or can be data from which the address index offset can be derived by the PMC 120. If the data is data from which the address index offset can be derived, the PMC 120 determines the address index offset from the data. If an enable is implemented, such as in packet-based address index modification examples, this data can also be indicative of whether the address index offset logic 324 is to be enabled.

The PMC 120 then transmits respective packets or requests for writing values to various registers. In DPE-based address index modification examples, the packets or requests include data to write the address index offset to the AIO register 402 and, if implemented, to write the row limit to the row limit register 406. When the AIO register 402 and row limit register 406 are not part of configuration registers 312 of the tile 118-00, the PMC 120 transmits memory mapped write requests to write the address index offset and, if implemented, row limit via the NPI 130. When the AIO register 402 and row limit register 406 are part of configuration registers 312 of the tile 118-00, the PMC 120 transmits packets to write the address index offset and, if implemented, row limit via the programmable network 128 of the NoC 112 to tiles 118 that are connected to the programmable network 128 via the NoC interface(s) 318.

In packet-based address index modification examples, the packets include data to write the enable signal and/or address index offset to the configuration registers 312 of the tiles 118. The PMC 120 transmits packets to write the enable signal and/or address index offset via the programmable network 128 of the NoC 112 to tiles 118 that are connected to the programmable network 128 via the NoC interface(s) 318.

Any packet transmitted via the programmable network 128 is received via NoC interface(s) 318 and a bridge 322, which converts the packet to a memory mapped packet that contains a destination address. The bridge 322 forwards the memory mapped packet to the memory mapped switch 320, and the memory mapped switch 320 determines where to route the memory mapped packet based on the destination address. The memory mapped switch 320 analyzes the destination address to determine whether the targeted tile 118 is in a column west of the receiving tile 118, in the column of the receiving tile 118, or in a column east of the receiving tile 118. If the targeted tile 118 is in a column east or west of the receiving tile 118, the memory mapped switch 320 routes the memory mapped packet east or west, respectively. This continues at each receiving tile 118 until the memory mapped switch 320 of the receiving tile 118 determines that the receiving tile 118 is in the column of the targeted tile 118 based on the destination address. Then, the memory mapped switch 320 at the receiving tile 118 determines whether the targeted tile 118 is in a same or different row as the receiving tile 118. If the memory mapped switch 320 determines that the targeted tile 118 is in a different row, the memory mapped switch 320 would route the memory mapped packet north; however, at this stage, the memory mapped packet targets a tile 118 (which are in a same row), so the receiving tile 118 is the target tile 118. Hence, the destination address of the memory mapped packet targets a memory space within the receiving tile 118. The memory mapped switch 320 then directs the memory mapped packet to the configuration registers 312 for writing the address index offset, row limit, and/or enable signal, where appropriate, to the appropriate bits of the configuration registers 312. In packet-based address index modification examples, the address index offset that is written to configuration registers 312 of different tiles 118 is a same value in some examples.

In DPE-based address index modification examples, when the A10 register 402 is written with an address index offset, modified row identifications are propagated from the adders 404 and to corresponding memory mapped switches 224. For example, when the address index offset is negative two, a row identification of −1 is propagated to memory mapped switches 224 of DPEs 114-x1; a row identification of 0 is propagated to memory mapped switches 224 of DPEs 114-x2; a row identification of 1 is propagated to memory mapped switches 224 of DPEs 114-x3; etc. This can modify the row identifications of memory mapped switches 224 of DPEs 114.

The PMC 120 may also execute additional program code stored in ROM 122 to provide a minimal configuration for the SoC 100. The local ROM 122 may also include some minimal configuration data of the SoC 100. For example, various subsystems may be configured to permit communications before a boot image file can be accessed. As an example, a memory controller of the HB 108 and an I/O circuit of the I/O 110 may be configured (e.g., by configuration data stored in the local ROM 122) and brought to a stable state before the boot image file can be accessed.

The PMC 120 executes program code stored in ROM 122 to access a boot image file stored on flash memory 132, for example. The PMC 120 reads a boot header and a platform load manager (PLM) of the boot image file from the flash memory 132 exterior to the SoC 100. The boot image file is a file resulting from compiling a user application to be implemented on the SoC 100. The PMC 120 executing code stored in the local ROM 122 accesses the boot image file via a memory controller in the HB 108 and an I/O 110. The PMC 120, based on data read from the boot header, reads the PLM and writes the PLM to the local RAM 124 in the PS 104. Control is handed over to the PLM by the PMC 120 executing the executable code of the PLM that is stored in the RAM 124. Execution of the PLM by the PMC 120 results in the boot image file, including binaries and bitstreams, being loaded on the various subsystems of the SoC 100.

More particularly with respect to the DPE array 102, the PMC 120 executing the PLM transmits packets containing destination addresses and binaries (e.g., configuration data) of target tiles 118 and DPEs 114 via the programmable network 128 of the NoC 112 to tiles 118 connected to the programmable network 128 via NoC interface(s) 318. As described above, the bridge 322 converts the received packet to a memory mapped packet that contains the destination address. The bridge 322 forwards the memory mapped packet to the memory mapped switch 320, and the memory mapped switch 320 determines where to route the memory mapped packet based on the destination address. The memory mapped switch 320 routes the memory mapped packet east or west until the memory mapped switch 320 determines that the receiving tile 118 is in the column of the targeted DPE 114 or tile 118. Then, the memory mapped switch 320 at the receiving tile 118 determines whether the targeted DPE 114 or tile 118 is in a same or different row as the receiving tile 118. If the memory mapped switch 320 determines that the targeted DPE 114 or tile 118 is in a different row, the memory mapped switch 320 routes the memory mapped packet north, and if not, the memory mapped switch 320 directs the memory mapped packet to the configuration registers 312 of the receiving tile 118 for writing the binaries to the configuration registers 312.

In packet-based address index modification examples, any memory mapped packet that is routed north from a memory mapped switch 320 is received at the address index offset logic 324. If the address index offset logic 324 implements an enable signal, and that enable signal is disabled based on data written to the configuration registers 312, the memory mapped packet is passed through the address index offset logic 324 unchanged to the memory mapped switch 224 of the neighboring DPE 114 to the north of the tile 118. If the address index offset logic 324 implements an enable signal, which is disabled based on data written to the configuration registers 312, or if the address index offset logic 324 does not implement an enable signal, the address index offset logic 324 adds the address index offset to the destination address of the memory mapped packet, like shown in FIG. 5. The address index offset logic 324 then transmits the memory mapped packet with the modified destination address to the memory mapped switch 224 of the neighboring DPE 114 to the north of the tile 118.

In DPE-based address index modification examples, any memory mapped packet that is routed north from a memory mapped switch 320 is at the memory mapped switch 224 of the neighboring DPE 114 to the north of the tile 118. In these examples, the memory mapped packet may have a destination address that is not modified by the tile 118.

At each receiving DPE 114, the memory mapped switch 224 determines whether the targeted DPE 114 is in a same or different row as the receiving DPE 114 based on the destination address of the memory mapped packet and the row identification of the receiving DPE 114. The memory mapped switch 224 of the receiving DPE 114 compares the row identification of the receiving DPE 114 (which may have been previously modified in DPE-based address index modification examples) to a target row identification within the destination address of the memory mapped packet (which may have been previously modified in packet-based address index modification examples). If the memory mapped switch 224 determines that the row identification of the target row identification of the targeted DPE 114 within the destination address does not match the row identification of the receiving DPE 114, the memory mapped switch 224 routes the memory mapped packet north, and if not, the memory mapped switch 224 directs the memory mapped packet, based on the destination address, to the configuration registers 210, 218, or 222, program memory 208, or memory bank 212 of the receiving DPE 114 for writing the binaries to the configuration registers 210, 218, or 222, program memory 208, or memory bank 212. In some examples, if the memory mapped switch 224 determines that the row identification of the target row identification of the targeted DPE 114 within the destination address does not match the row identification of the receiving DPE 114 and the end-of-range signal from a corresponding comparator 408 received by the memory mapped switch 224 is asserted, the memory mapped switch 224 can respond with an out-of-range error message indicating that the memory mapped packet targets a DPE 114 outside of a permissible range of DPEs 114.

In packet-based address index modification examples, the address index offset shifts the target row identification in the destination address of a memory mapped packet by a number of rows. The modified destination address can cause a DPE 114 at a location the number of rows, within the same column, from the originally targeted DPE 114 to become the targeted DPE 114 of the memory mapped packet (e.g., instead of the originally targeted DPE 114). In DPE-based address index modification examples, the address index offset shifts the row identifications of DPEs 114. The modified row identification of DPEs 114 can cause a DPE 114 at a location the number of rows, within the same column, from the originally targeted DPE 114 to become the targeted DPE 114 of the memory mapped packet (e.g., instead of the originally targeted DPE 114). In packet-based address index modification and DPE-based address index modification examples, the address index offset can be a positive or negative value depending on, e.g., how the user application was mapped to the DPE array 102 by a compiler and/or the underlying memory address architecture of the DPE array 102.

Loading the binaries to the tiles 118 and DPEs 114 results in the user application being loaded on the DPE array 102. The user application can then be operated on the DPE array 102. More broadly, the SoC 100 can be operated according to the user application.

Implementing packet-based address index modification and/or DPE-based address index modification examples permits shifting or translating on which DPEs 114 the user application is loaded from the DPEs 114 on which the user application was mapped and routed by a compiler. The address index offset logic 324 and/or 400 can translate or shift to which DPEs 114 binaries (e.g., configuration data) are targeted to load the user application onto a region of the DPE array 102 that is translated from where the user application was mapped by the compiler.

In some cases, this translation or shifting can cause DPEs 114 to be intervening between the DPEs 114 on which the user application is loaded and tiles 118 that interface to other subsystems (e.g., PL 106 and/or NoC 112). Those intervening DPEs 114 are not loaded with binaries compiled as part of the user application. The intervening DPEs 114 and the corresponding stream switches 220 can retain the initial or default configuration such that the stream switches 220 remain in a pass-through mode. These stream switches 220 being in pass-through mode permits data streams to pass through these stream switches 220 such that the data streams are directed to the same tiles 118 that were mapped by the compiler.

Enabling the shifting of on which DPEs 114 a user application is loaded can permit device recovery. The SoC 100 can be implemented as if the DPE array 102 has fewer DPEs 114 than the DPE array 102 actually includes. For example, as manufactured, some DPEs 114 may be defective or non-functional, and if a sufficient number of contiguous DPEs 114 are functional, the SoC 100 may be implemented as a SoC with fewer DPEs 114.

SoCs having a same general architecture but different numbers of resources can be provided as different product lines. For example, SoCs of a first product line can have 400 DPEs 114 (e.g., a 20 row×20 column array); SoCs of a second product line can have 200 DPEs 114 (e.g., a 10 row×20 column array); and SoCs of a third product line can have 100 DPEs 114 (e.g., a 5 row×20 column array). The SoCs of the product lines can have the same resources outside of the DPE array 102, or SoCs of each successive product line can have fewer resources outside of the DPE array 102. A SoC 100 can be manufactured according to the first product line (e.g., with a DPE array 102 having a 20 row×20 column array of DPEs 114). Depending on which DPEs 114 of the DPE array 102 are functional or defective for the SoC 100, the SoCs 100 can be implemented in the first, second, or third product line. The SoC 100 can be implemented in a product line if the SoC 100 has a minimum number of contiguous functional DPEs 114 corresponding to that product line. For example, if no DPEs 114 of the SoC 100 are defective, the SoC 100 can be implemented in the first product line; if some DPEs 114 of the SoC 100 are defective but a 10 row×20 column array of DPEs 114 are functional, the SoC 100 can be implemented in the second product line; and if some DPEs 114 of the SoC 100 are defective but a 5 row×20 column array of DPEs 114 are functional, the SoC 100 can be implemented in the third product line.

Each of the SoCs of the different product lines implement a same protocol or memory address architecture so that a user application mapped and routed on a SoC of, e.g., the third product line can be loaded onto a SoC that is manufactured according to the first or second product line but, due to defects, is implemented in the third product line. This technique can be implemented to recover SoCs with defective DPEs for lower resource product lines.

In some examples, if a DPE 114 is defective, the stream switch 220 and memory mapped switch 224 of the DPE interconnect network 206 in that DPE 114 may be required to be functional. The stream switch 220 and memory mapped switch 224 of a defective DPE 114 may be required to receive and transmit data streams and/or memory mapped packets. This possible requirement may depend on a location of the defective DPE 114 within the DPE array 102. For example, if a defective DPE 114 is disposed in a column between one or more of the number of contiguous functional DPEs 114 and a tile 118, the stream switch 220 and memory mapped switch 224 of the defective DPE 114 will be functional; otherwise, the stream switch 220 and memory mapped switch 224 of the defective DPE 114 may be non-functional.

In some examples, the number of contiguous functional DPEs 114 for a SoC to be implemented in a given product line are arranged in an array having a same number and arrangement as DPEs 114 of a SoC designed and manufactured for that product line. For example, a SoC manufactured according to the second product line (e.g., having DPEs 114 in a 10 row×20 column array) and having some DPEs 114 that are defective would have at least contiguous functional DPEs 114 in a 5 row×20 column array to be implemented in the third product line. Additionally, the arrangement of the DPEs 114 within the contiguous functional DPEs in the 5 row×20 column array would be the same as a SoC manufactured for the third product line. As described previously, for example, DPEs 114 in selected rows can be horizontally inverted or flipped relative to DPEs 114 in respective adjacent rows (e.g., which can enable access by a core 202 to memory of a memory module 204 of a vertically neighboring DPE 114). In such situations, a defective DPE 114 in one row can preclude a neighboring row from being included in the number of contiguous functional DPEs 114. For example, referring back to FIG. 1, assuming DPEs 114-*x*2 are horizontally flipped or inverted relative to DPEs 114-*x*1, 114-*x*3, if any DPE 114-*x*1 is defective, DPEs 114-*x*2 would be precluded from being included in the number of contiguous functional DPEs 114. Under these conditions, the translation or shifting of configuration data from, e.g., DPE 114-01 to DPE 114-02 may not be seamless since memory accesses to neighboring DPEs 114 by DPE 114-02 is not a same pattern as memory accesses by DPE 114-01 to neighboring DPEs 114.

In some examples, a DPE array can be arbitrarily divided into a number of segments. In such examples, if any DPE 114 within a segment is defective, another one or more segment can be implemented as the contiguous functional DPEs 114. For example, if the DPE array is arbitrarily divided into two halves, one or more DPEs within one half are defective, and all DPEs within the other half are functional, the half having all functional DPEs 114 can be implemented as the contiguous functional DPEs 114 (e.g., even if a larger amount of contiguous functional DPEs could be implemented). In other examples, a DPE array could be divided into three segments (e.g., three groups of contiguous rows), four segments (e.g., four groups of contiguous rows), five segments, etc. Depending on the recovery scheme, one or more segments can be implemented to implement the continuous functional DPEs. Segmenting a DPE array in such a way can facilitate determinations of how to implement products.

After a SoC 100 is manufactured, the SoC 100 is tested for functionality of components of the SoC 100, including functionality of the DPEs 114. Based on this testing, defective DPEs 114 can be identified. Once identified, a determination is made whether a sufficient number of contiguous functional DPEs 114 of the SoC 100 are arranged in an array having a same number and arrangement as DPEs 114 of a SoC manufactured for any product line. If not, the SoC 100 may be discarded. If so, the SoC 100 can be implemented in any product line of SoCs that have a number of contiguous functional DPEs 114 that is not more than the number of contiguous functional DPEs 114 on the manufactured SoC 100 and that has a same arrangement of the number of contiguous functional DPEs 114 on the manufactured SoC 100.

If the SoC 100 can be implemented in a product line that is designed and manufactured to have fewer DPEs 114 than the SoC 100 has, an identification corresponding to respective locations of each defective DPE 114 of the SoC 100 is written to memory on the SoC 100. For example, the identification can be written to ROM 122 (e.g., eFuses) in the PS 104 of the SoC 100. The identification may be written to ROM 122 as part of the manufacturing and testing or as part of a one-time registration process that includes downloading the identification from a database. The identification, in some examples, includes an identification of the row in which the defective DPE 114 is disposed in the DPE array 102. Additionally, a number of rows of the number of contiguous functional DPEs 114 that are to be implemented by the SoC 100 can also be written to the memory (e.g., ROM 122). During the boot sequence described above, the PMC 120 can read the identification(s) of one or more rows in which a defective DPE 114 is disposed and, possibly, the number of rows of the number of contiguous functional DPEs 114. With this information, the PMC 120 can derive the address index offset. If appropriate, the PMC 120 can determine what rows are precluded from being included in the contiguous functional DPEs 114 due to defect or lack of corresponding arrangement. The PMC 120 can then determine where the number of rows can be located in the DPE array 102 where that number of rows does not include a row that is identified as including a defective DPE 114 or that is precluded from being included due to a lack or corresponding arrangement. Based on the derived location for the number of rows, the PMC 120 can determine the address index offset between the derived location (e.g., the row of DPEs 114 within the location most proximate to the tiles 118) and the tiles 118. The PMC 120 can package the address index offset in one or more packets or requests and transmit the one or more packets or requests to the DPE array 102. Once received at the DPE array 102, the one or more packets or requests cause the address index offset to be written to appropriate A10 register 402 and/or configuration registers 312 as described above.

Alternatively or additionally, an indication of a location of the number of contiguous functional DPEs 114 in the DPE array 102 can be written to memory on the SoC 100. For example, the indication can be written to ROM 122 (e.g., eFuses) in the PS 104 of the SoC 100. The identification may be written to ROM 122 as part of the manufacturing and testing or as part of a one-time registration process that includes downloading the identification from a database. The indication, in some examples, includes an indication of the row of the contiguous functional DPEs 114 that is most proximate and/or most distal from the tiles 118 in the DPE array 102. Additionally, if the indication is of a most distal row, a number of rows of the number of contiguous functional DPEs 114 that are to be implemented by the SoC 100 is also written to the memory (e.g., ROM 122). During the boot sequence described above, the PMC 120 can read the identification of the location and, if appropriate the number of rows of the number of contiguous functional DPEs 114. With this information, the PMC 120 can derive the address index offset. Based on the location and, in some instances, the number of rows, the PMC 120 can determine the address index offset between the location (e.g., the row of DPEs 114 within the location most proximate to the tiles 118, which may be based on the number of rows if the identified location is most distal from the tiles 118) and the tiles 118. The PMC 120 can package the address index offset in one or more packets or requests and transmit the one or more packets or requests to the DPE array 102. Once received at the DPE array 102, the one or more packets or requests cause the address index offset to be written to appropriate A10 register 402 and/or configuration registers 312 as described above.

Alternatively or additionally, an address index offset, which is based on the location of a defective DPE 114 and/or a location of the number of contiguous functional DPEs 114 in the DPE array 102, can be written to memory on the SoC 100. For example, the address index offset can be written to ROM 122 (e.g., eFuses) in the PS 104 of the SoC 100. The address index offset and/or a location of the number of contiguous functional DPEs 114 may be written to ROM 122 as part of the manufacturing and testing or as part of a one-time registration process that includes downloading the identification from a database. During the boot sequence described above, the PMC 120 can read the address index offset written to the ROM 122, package the address index offset in one or more packets or requests, and transmit the one or more packets or requests to the DPE array 102. Once received at the DPE array 102, the one or more packets or requests cause the address index offset to be written to appropriate A10 register 402 and/or configuration registers 312 as described above.

In further examples, instead of and/or in addition to storing an identification corresponding to respective locations of each defective DPE 114, a location of the number of contiguous functional DPEs 114, and/or an address index offset and/or a location of the number of contiguous functional DPEs 114 in ROM 122, such information may be determined by a self-test performed by the SoC 100. The self-test can be performed on power up of the SoC 100. Any other mechanism by which such information can be obtained may be implemented.

A user can create an application that can be compiled and loaded onto the SoC 100, including onto the DPE array 102. The application can be a file including source code that defines the functionality of the application. The application can be implemented according to a graph programming model. The application can include kernel source code that defines kernels, and can define communication links (e.g., data flows) that link the kernels. The application can be written in various types of object orientated programming languages (e.g., C++ or another language). An advantage of implementing a graph programming model for the application is that a graph can have a highly parallelized architecture. In some examples, the semantics of the graph established by the application is based upon the general theory of Kahn Process Networks which provides a computation model for deterministic parallel computation that is applied to the heterogeneous architecture in the SoC 100 (which includes different programmable architectures, e.g., the DPE array 102, the PS 104, and/or the PL 106).

A compiler (e.g., a software tool executing on a computer) can map and route the application on a known product line of a SoC 100 and generate binaries for loading on a DPE array 102 of the SoC 100. The compiler can be aware of the product line, and hence, the number of contiguous functional DPEs 114 of the product line, on which the application is mapped and routed. Generally, the mapping and routing of an application is based on the DPE array 102 of a SoC 100 manufactured according to the known product line (e.g., with no defective DPEs 114 in the DPE array 102). In such circumstances, the contiguous functional DPEs 114 of the known product line are adjacent to the tiles 118 in the DPE array 102.

Due to the possibility that a SoC 100 manufacture according to a different product line may be implemented in the known product line, the compiler may not be aware of the DPE array 102 of the SoC 100 on which the application is actually loaded. The compiler may not be aware of where the contiguous functional DPEs 114 may be disposed within a DPE array 102 of the SoC 100 on which the application is loaded. The compiler can be aware of the different DPE arrays 102 of SoCs 100 that may be manufactured according to one or more different product lines but may be implemented in the known product line, e.g., due to defects in the respective SoC 100. The compiler can analyze the mapping and routing of the application based on these SoCs that are manufactured according to different product lines. The compiler can analyze the mapping and routing to ensure that, for a worst-case scenario, the application as loaded onto a SoC 100 is capable of meeting, e.g., timing constraints.

After the timing analysis, the compiler can generate a boot image file comprising binaries of the application mapped to the DPEs 114 of the DPE array 102 of a SoC 100 manufactured according to the known product line. The binaries can be loaded onto a SoC 100 that is manufactured according to the known product line, and the destination addresses contained within those binaries for DPEs 114 in the DPE array 102 are not re-indexed. If the binaries are loaded onto a SoC 100 that is manufactured according to a different product line but implemented in the known product line, the destination addresses of the binaries can be re-indexed to load the application to different DPEs 114.

Figure 6:
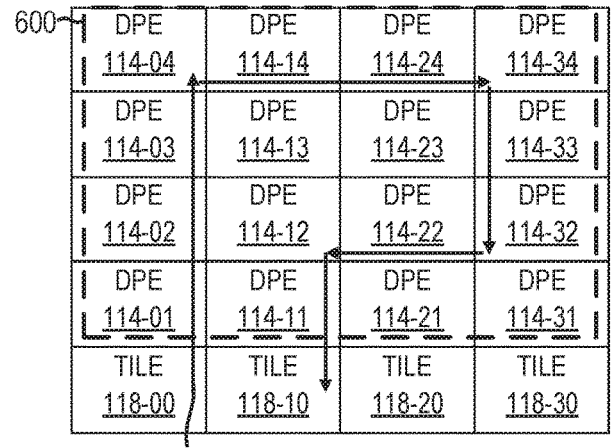

As a rudimentary example, a known product line has a SoC 100 with a DPE array 102 having a 4 row×4 column array of DPEs 114, like shown in FIG. 6. A SoC 100 manufactured according to a different product line can be implemented in the known product line. For example, a SoC 100 with a DPE array 102 having an 8 row×4 column array of DPEs 114, like shown in FIG. 7, can be implemented in the known product line, such as when one or more of the DPEs 114 are defective.

A user creates an application that is mapped and routed on the DPE array 102 of a SoC 100 manufactured according to the known product line. The actual DPE array 102 of the SoC 100 on which the application is loaded may be transparent to the user, and the user can believe that the SoC 100 has the DPE array 102 of a SoC 100 manufactured according to the known product line (e.g., a 4 row×4 column array of DPEs 114). The compiler maps and routes the application on the DPE array 102 of a SoC 100 manufactured according to the known product line. For example, in FIG. 6, an application 600, with a data stream 602-1, is mapped and routed on the DPE array 102 having DPEs 114 arranged in a 4 row×4 column array adjacent to a row of tiles 118.

Figure 7:
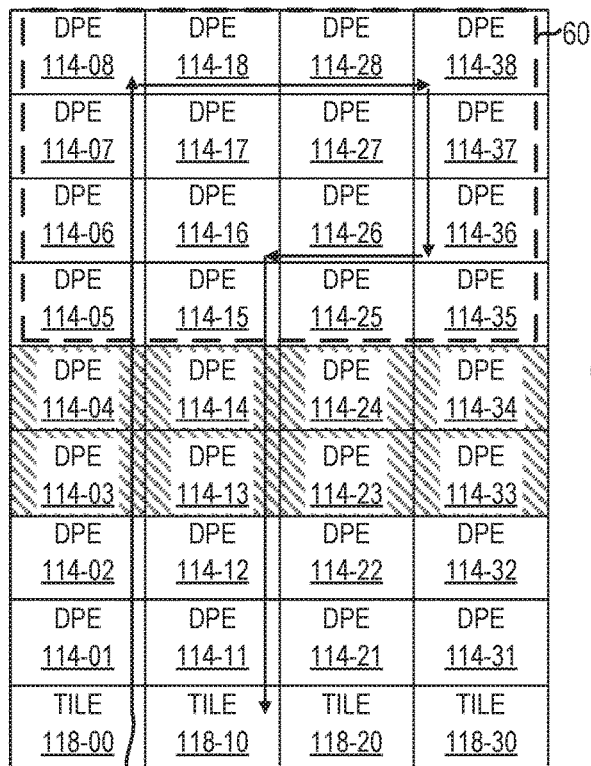

The compiler can be aware of different DPE arrays 102 of SoCs 100 manufactured according to different product lines on which the application can be loaded. The compiler can analyze the mapping and routing of the application for a worst-case scenario of where the application can be loaded. For example, as shown in FIG. 7, the four rows most distal from the tiles 118 are the worst-case location. Generally, the data stream between DPEs 114 is not affected based on where the application 600 is loaded since the DPEs 114 will be contiguous. As shown by FIGS. 6 and 7, data streams 602-1, 602-2 between DPEs 114 on which the application 600 is loaded does not change depending on where the application 600 is loaded. However, the data stream between a DPE 114 and a tile 118 can be affected since where the application 600 is loaded affects the number of DPEs 114 through which such a data stream will propagate. As shown by FIG. 7, a data stream 602-2 that communicates with, e.g., the PL 106 or PS 104 via tiles 118-00 and 118-10, traverses DPEs 114-01, 114-02, 114-03, 114-04, 114-14, 114-13, 114-12, 114-11. Compared to where the application 600 is loaded to the DPEs 114 most proximate to the tiles 118 in FIG. 6, the data stream 602-1 does not traverse any DPEs 114 outside of where the application 600 is loaded. The compiler therefore analyzes the mapping and routing of the application based on the worst-case scenario to ensure that timing constraints are met, e.g., since the data stream 602-2 can be longer and have more delay between where the application 600 is loaded and the tiles 118 compared to the data stream 602-1.

If the mapping and routing of the application 600 meets timing constraints when loaded as mapped and routed as well as when loaded in a worst-case scenario, the compiler generates binaries in a boot image file. The binaries have destination addresses for configuration data of the DPEs 114 based on the mapping and routing of the application to a DPE array 102 of a SoC 100 manufactured according to the known product line (e.g., a 4 row×4 column array of DPEs 114 as shown in FIG. 6).

Assume for any product line of SoC 100 that the memory space (e.g., any configuration registers, program memory, memory banks, etc.) of each DPE 114 and tile 118 is 1 kilobyte, which can be addressed by a 10-bit address. Further, to address any memory space in a DPE 114 and tile 118, a memory mapped packet can be formatted with a 16-bit destination address having bits b[15:14] be two bits indicating a column of a target DPE 114 or tile 118, bits b[13:10] being four bits indicating a row of the target DPE 114 or tile 118, and bits b[9:0] be ten bits indicating the intra-address within the target DPE 114 or tile 118. This destination address format is shown below:

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| Column | | Row | | | | Intra-address | | | | | | | | | |

As an example, to address memory space within tile 118-00, the destination address has bits b[15:10]='000000', and to address memory space within DPE 114-34, the destination address has bits b[15:10]='110100'. The binaries of the boot image file can include configuration data having destination addresses with bits b[15:10] within a range of '000000' and '110100' since the binaries were compiled based on the mapping and routing of the application on the DPE array 102 of the SoC 100 manufactured according to the known product line.

Assume that the binaries of the application 600 are loaded onto a SoC 100 that was manufactured according to and implemented in the known product line. In this example, the SoC 100 has the 4 rows×4 columns of DPEs 114 as shown in FIG. 6. The SoC 100 can have data written to ROM 122 indicating that the address index offset is to be zero and/or that the address index offset logic 324, 400 is to be disabled. The PMC 120 writes the zero for the address index offset and/or the disable to the configuration registers 312 (e.g., by keeping a default state from a boot sequence) as described above. In DPE-based address index modification examples under these circumstances, the row identifications received at the memory mapped switches 224 of the DPEs 114 remain unchanged from the default state.

The configuration data of the binaries are loaded onto the DPE array 102 of the SoC 100 using memory mapped packets using the memory addresses contained in the binaries. When a memory mapped packet is received by a memory mapped switch 320 in a tile 118, the memory mapped switch 320 can determine where to route the memory mapped packet first based on bits b[15:14]. If bits b[15:14] indicate a column at a position west of the receiving tile 118 (e.g., if bits b[15:14] are less than the column of the receiving tile 118), the memory mapped switch 320 routes the memory mapped packet west. If bits b[15:14] indicate a column at a position east of the receiving tile 118 (e.g., if bits b[15:14] are greater than the column of the receiving tile 118), the memory mapped switch 320 routes the memory mapped packet east. If bits b[15:14] indicate the column of the receiving tile 118 (e.g., if bits b[15:14] are equal to the column identification of the receiving tile 118), the memory mapped switch 320 determines whether bits b[13:10] indicate the row of the receiving tile 118. If bits b[13:10] indicate the row of the receiving tile 118 (e.g., if bits b[13:10]='0000'), the memory mapped switch 320 writes data of the memory mapped packet to the memory space indicated by bits b[9:0] in the destination address. If the bits b[13:10] do not indicate the row of the receiving tile 118 (e.g., if bits b[13:10]!='0000'), the memory mapped switch 320 routes the memory mapped packet north. In packet-based address index modification examples, routing of the memory mapped packet north routes the packet to the address index offset logic 324 of the respective tile 118. Since the address index offset is set to zero and/or the address index offset logic 324 is disabled, the memory mapped packet passes through the address index offset logic 324 without the destination address of the memory mapped packet being modified. In both DPE-based address index modification and packet-based address index modification examples, the memory mapped packet is then transmitted to the memory mapped switch 224 of the DPE 114 neighboring the tile 118

Similarly, at a receiving memory mapped switch 224 in any DPE 114, the memory mapped switch 224 determines whether bits b[13:10] indicate the row of the receiving DPE 114 by comparing bits b[13:10] to the assigned row identification from an adder 404 associated with the row of DPEs 114 in which the receiving DPE 114 is disposed. If bits b[13:10] are equal to the row identification of the receiving DPE 114, the memory mapped switch 224 writes data of the memory mapped packet to the memory space indicated by bits b[9:0] in the destination address. If the bits b[13:10] do not match the row identification of the receiving DPE 114, the memory mapped switch 224 routes the memory mapped packet north.

Accordingly, in this example, the application 600 is loaded onto the DPEs 114 on which the application 600 was mapped by the compiler. In DPE-based address index modification examples, the address index offset logic 400 does not change the row identifications of DPEs 114, and in packet-based address index modification examples, the address index offset logic 324 does not change destination addresses of memory mapped packets. This permits the configuration data transmitted by the memory mapped packets to be loaded at destination addresses where that configuration data was mapped by the compiler.

Next, assume that the binaries of the application 600 are loaded onto a DPE array 102 of a SoC 100 that was manufactured according to a different product line and implemented in the known product line. In this example, the SoC 100 on which the application is loaded has 8 rows×4 columns of DPEs 114 as shown in FIG. 7. The SoC 100 can have data written to ROM 122 indicating that the address index offset is to be four and/or that the address index offset logic 324, 400 is to be enabled. As shown in FIG. 7, a DPE 114-*x*3 and/or 114-*x*4 can be defective, which precludes any DPE 114-*x*3, 114-*x*4 from being part of the contiguous functional DPEs 114. As such, to implement the known product line by the SoC 100, the address index offset is four or negative four depending on implementation indicating that the application 600 is to be loaded shifted by four rows. The PMC 120 writes the four or negative four for the address index offset and/or the enable as described above. In DPE-based address index modification examples, writing negative four to the A10 register 402 modifies the row identifications of rows of DPEs 114 as follows: to −3 for DPEs 114-*x*1; to −2 for DPEs 114-*x*2; to −1 for DPEs 114-*x*3; to 0 for DPEs 114-*x*4; to 1 for DPEs 114-*x*5; to 2 for DPEs 114-*x*6; to 3 for DPEs 114-*x*7; and to 4 for DPEs 114-*x*8.

Like the preceding example, the configuration data of the binaries are loaded onto the DPE array 102 of the SoC 100 using memory mapped packets using the destination addresses contained in the binaries. When a memory mapped packet is received by a memory mapped switch 320 in a tile 118, the memory mapped switch 320 can determine where to route the memory mapped packet horizontally (east-west) based on bits b[15:14], as described above. If bits b[15:14] indicate the column of the receiving tile 118 (e.g., if bits b[15:14] are equal to the column of the receiving tile 118), the memory mapped switch 320 determines whether bits b[13:10] indicate the row of the receiving tile 118. If bits b[13:10] indicate the row of the receiving tile 118 (e.g., if bits b[13:10]='0000'), the memory mapped switch 320 writes data of the memory mapped packet to the memory space indicated by bits b[9:0] in the destination address. If the bits b[13:10] do not indicate the row of the receiving tile 118 (e.g., if bits b[13:10]!='0000'), the memory mapped switch 320 routes the memory mapped packet north.

In packet-based address index modification examples, routing of the memory mapped packet north routes the packet to the address index offset logic 324 of the respective tile 118. The address index offset logic 324 modifies the destination address to offset the destination address by the address index offset (e.g., four rows). The address index offset logic 324 adds the address index offset (e.g., four) to bits b[13:10] to create a modified destination address. The address index offset logic 324 then transmits the memory mapped packet containing the modified destination address to the memory mapped switch 224 of the DPE 114 neighboring the tile 118. In DPE-based address index modification examples, the memory mapped packet is routed north to the memory mapped switch 224 of the DPE 114 neighboring the tile 118, e.g., without modifying the destination address of the memory mapped packet.

Similarly, at a receiving memory mapped switch 224 in any DPE 114, the memory mapped switch 224 determines whether bits b[13:10] of the destination address indicate the row of the receiving DPE 114 by comparing bits b[13:10] to the assigned row identification from an adder 404 associated with the row of DPEs 114 in which the receiving DPE 114 is disposed. If bits b[13:10] are equal to the row identification of the receiving DPE 114, the memory mapped switch 224 writes data of the memory mapped packet to the memory space indicated by bits b[9:0] in the destination address. If the bits b[13:10] do not match the row identification of the receiving DPE 114, the memory mapped switch 224 routes the memory mapped packet north.

Accordingly, in this example, the application 600 is not loaded onto the DPEs 114 on which the application 600 was mapped by the compiler, but is loaded onto DPEs 114 that are shifted four rows from the respective DPEs 114 on which the application 600 was mapped by the compiler. In DPE-based address index modification examples, the address index offset logic 400 changes the row identifications of DPEs 114, and in packet-based address index modification examples, the address index offset logic 324, 400 changes destination addresses of memory mapped packets. This permits the configuration data transmitted by the memory mapped packets to be loaded at addresses shifted from where that configuration data was mapped by the compiler.

In this example, due to the address index offset logic 400 changing the row identifications of DPEs 114 and/or the address index offset logic 324 adding the address index offset to the destination address, no memory mapped packet is capable of targeting DPEs 114-x1, 114-x2, 114-x3, 114-x4. As shown by FIG. 7, the data stream 602-2 traverses DPEs 114 in these rows. More specifically, the data stream 602-2 is routed through stream switches 220 in respective DPEs 114-01, 114-02, 114-03, 114-04, 114-14, 114-13, 114-12, 114-11. Accordingly, if, e.g., one or more of DPEs 114-03, 114-04, 114-13, 114-14 are defective, the respective stream switches 220 and memory mapped switches 320 of the DPEs 114-03, 114-04, 114-13, 114-14 are operational. Further, since no memory mapped packet targets the DPEs 114-01, 114-02, 114-03, 114-04, 114-14, 114-13, 114-12, 114-11 to configure the stream switches 220 in those DPEs, the pass-through mode configuration of these stream switches 220 established, e.g., by a boot sequence enabling the stream switches 220 to permit data stream 602-2 to be communicated through these stream switches 220.

Figure 8:
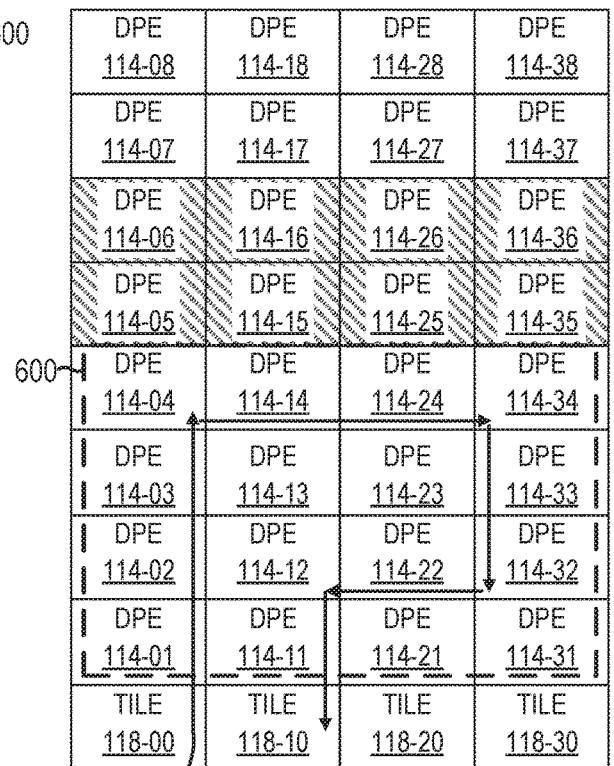

Next, assume that the binaries of the application 600 are loaded onto a DPE array 102 of a SoC 100 that was manufactured according to a different product line and implemented in the known product line. In this example, the SoC 100 on which the application is loaded has the 8 rows×4 columns of DPEs 114 as shown in FIG. 8. The SoC 100 can have data written to ROM 122 indicating that the address index offset is to be zero and/or that the address index offset logic 324, 400 is to be disabled. As shown in FIG. 8, a DPE 114-x5 and/or 114-x6 can be defective, which precludes any DPE 114-x5, 114-x6 from being part of the contiguous functional DPEs 114. As such, to implement the known product line by the SoC 100, the address index offset is zero indicating that the application 600 is to be loaded without shifting. The PMC 120 writes the zero for the address index offset and/or the disable (e.g., by keeping a default state from a boot sequence) as described above. The application 600 can be loaded as described with respect to FIG. 6. Since the number of contiguous functional DPEs 114 correspond in location and destination address as the DPEs 114 on which the application 600 was mapped by the compiler, the configuration data can be loaded onto the DPEs 114 by using memory mapped packets without modifying the row identification of DPEs or the destination address of the memory mapped packets.

Additionally, assume that the binaries of the application 600 are loaded onto a DPE array 102 of a SoC 100 that was manufactured according to a different product line and implemented in the known product line. In this example, the SoC 100 on which the application is loaded has the 8 rows×4 columns of DPEs 114 as shown in FIG. 9. The SoC 100 can have data written to ROM 122 indicating that the address index offset is to be two and/or that the address index offset logic 324, 400 is to be enabled. As shown in FIG. 9, a DPE 114-x1 and/or 114-x2 can be defective, which precludes any DPE 114-x1, 114-x2 from being part of the contiguous functional DPEs 114. As such, to implement the known product line by the SoC 100, the address index offset is two or negative two depending on implementation indicating that the application 600 is to be loaded shifted by two rows. The PMC 120 writes two or negative two for the address index offset and/or the enable as described above. The application 600 can be loaded as described with respect to FIG. 7, except with a different address index offset. FIG. 9 illustrates other DPEs 114 on which the application 600 with data stream 602-3 can be loaded.

The foregoing examples are described based on an architecture of a SoC, memory addressing scheme of the DPE array of the SoC, and compiling of an application. Any of these aspects can be varied, which can cause other aspects to be modified. For example, different address formats can be implemented; different routing can be implemented; different address indexing based on positioning of DPEs or tiles within a DPE array can be implemented; etc. Further, for example, mapping and routing of an application can be to a worst-case location and the address index offset logic can add, e.g., a negative value as the address index offset when the application is loaded on a DPE array of a SoC manufactured according to the known product line. Each of these various modifications are contemplated in different examples.

Figure 10:
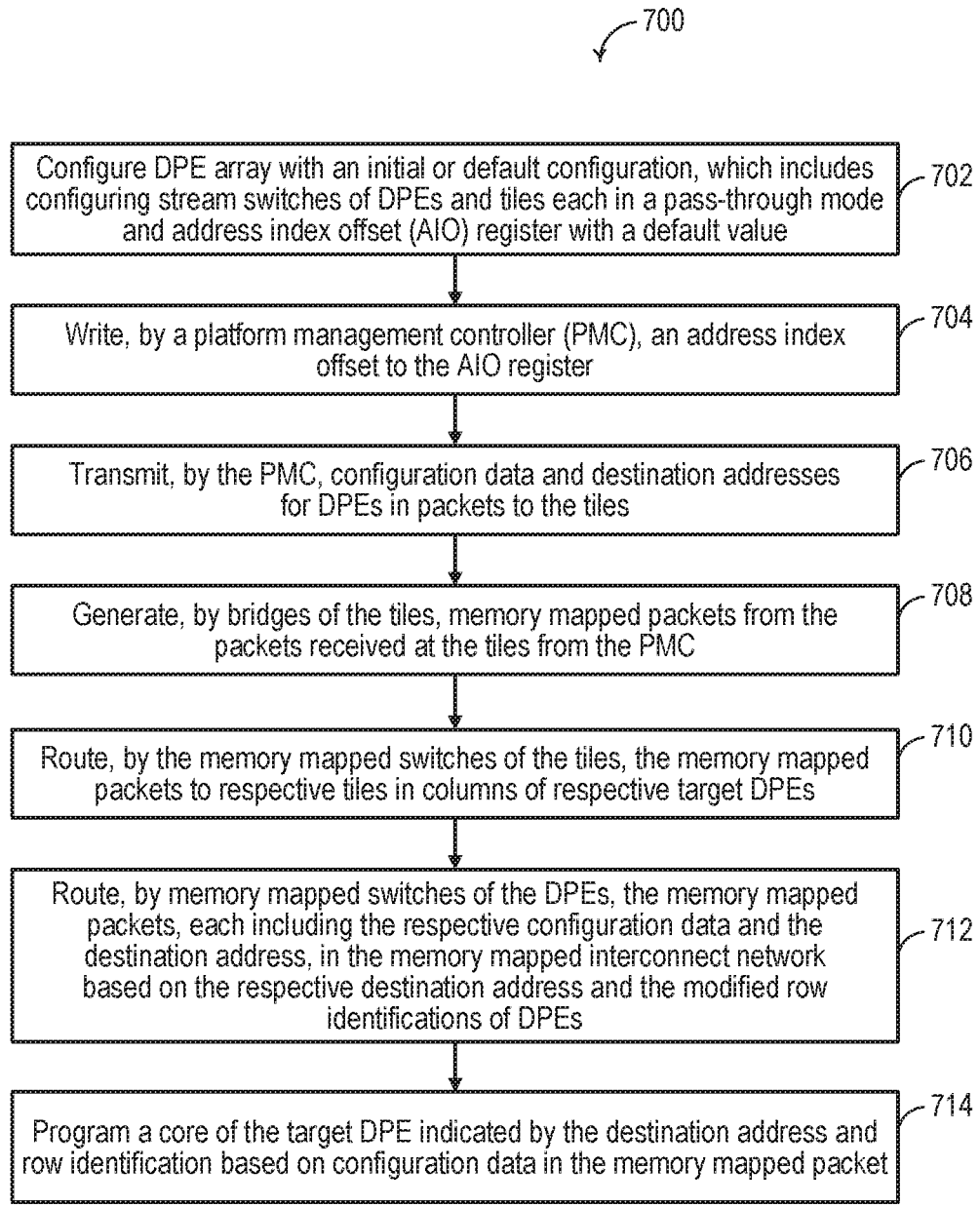
FIG. 10 is a flowchart of a method of operating a programmable device according to some examples.

FIG. 10 is a flowchart of a method 700 of operating a programmable device according to some examples. The programmable device has the architecture as described above with respect to FIGS. 1, 2, 3A, and 4, for example. The operation of the method 700 can be for DPE-based address index modification.

At block 702, the DPE array 102 is configured with an initial or default configuration, which includes configuring stream switches 220, 302 each in a pass-through mode and configuring the AIO register 402 with a default value (e.g., zero). At block 704, an address index offset is written to the AIO register 402 by the PMC 120. Writing the address index offset to the AIO register 402 causes row identifications received at memory mapped switches 224 of DPEs 114 to be modified by serially incrementing and accumulating the address index offset at the adders 404. In some examples, writing the address index offset to the AIO register 402 can include the PMC 120 reading data indicative of the address index offset from ROM 122, (if applicable) deriving the address index offset from the read data, transmitting one or more packets or requests containing the address index offset to the DPE array 102. If one or more write requests is transmitted, the requests can be transmitted via the NPI 130 to write to the AIO register 402. If one or more packets is transmitted, the one or more packets can be transmitted via the programmable network 128 to tiles 118, where memory mapped packets can be generated by the respective bridge 322, routed to the target tiles 118 by memory mapped switches 320, and caused to write the address index offset to the AIO register 402 that is included in a configuration register 312 of the target tile 118. In some examples, writing the address index offset to the AIO register 402 can include the PMC 120 performing a self-test (or other mechanism) to obtain data indicative of the address index offset from ROM 122, deriving the address index offset from the obtained data, and transmitting one or more packets or requests as described.

At block 706, the PMC 120 transmits configuration data and destination addresses for DPEs 114 in packets to the tiles 118. At block 708, the bridges 322 of the tiles 118 generate memory mapped packets from the packets received at the tiles 118 from the PMC 120. The memory mapped packets include the respective configuration data and respective destination addresses. At block 710, the memory mapped packets are routed by the memory mapped switches 320 to respective tiles 118 in columns of respective target DPEs 114. At block 712, the memory mapped packets are routed, by memory mapped switches 224 of DPEs 114, in the memory mapped interconnect network of DPEs 114 based on the destination address and the modified row identifications resulting from writing the address index offset at block 704. At block 714, a core 202 of the target DPE 114 indicated by the destination address and row identification is programmed based on configuration data in the memory mapped packet.

Figure 11:
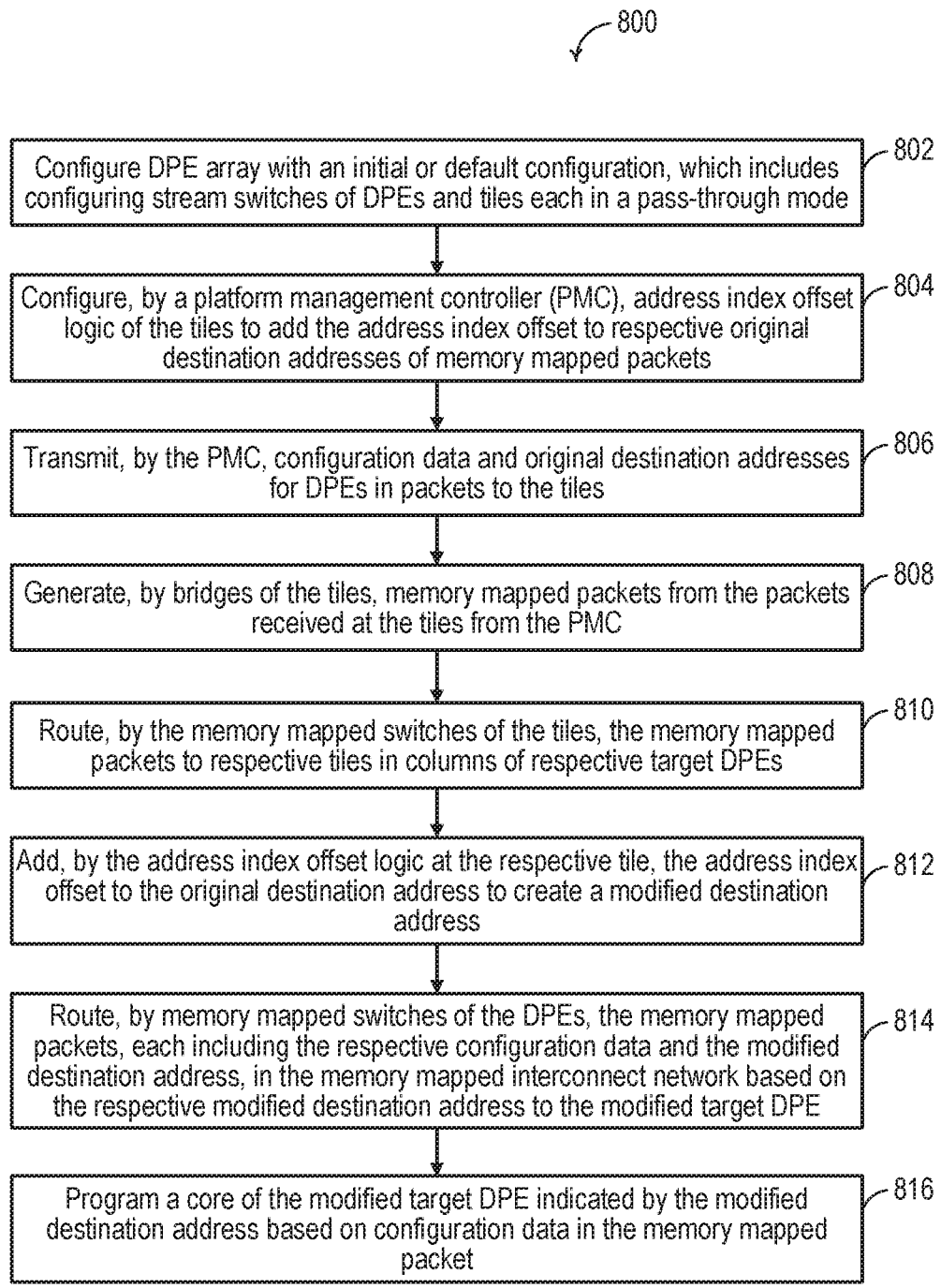
FIG. 11 is a flowchart of a method of operating a programmable device according to some examples.

FIG. 11 is a flowchart of a method 800 of operating a programmable device according to some examples. The programmable device has the architecture as described above with respect to FIGS. 1, 2, 3B, and 5, for example. The operation of the method 700 can be for packet-based address index modification.

At block 802, the DPE array 102 is configured with an initial or default configuration, which includes configuring stream switches 220, 302 each in a pass-through mode. At block 804, the address index offset logic 324 of the tiles 118 are configured, by the PMC 120, to add the address index offset to respective original destination addresses of memory mapped packets. In some examples, configuring the address index offset logic 324 can include the PMC 120 reading data indicative of an enable signal and/or the address index offset from ROM 122, (if applicable) deriving the address index offset from the read data, transmitting one or more packets containing the address index offset and/or enable signal to the tiles 118, generating memory mapped packets by the respective bridge 322, routing the memory mapped packets to the target tiles 118 by memory mapped switches 320, and writing the address index offset and/or enable signal to a respective configuration register 312 of the target tile 118. In some examples, configuring the address index offset logic 324 can include the PMC 120 performing a self-test (or other mechanism) to obtain data indicative of an enable signal and/or the address index offset from ROM 122, deriving the address index offset from the obtained data, transmitting one or more packets containing the address index offset and/or enable signal to the tiles 118, generating memory mapped packets by the respective bridge 322, routing the memory mapped packets to the target tiles 118 by memory mapped switches 320, and writing the address index offset and/or enable signal to a respective configuration register 312 of the target tile 118.

At block 806, the PMC 120 transmits configuration data and original destination addresses for DPEs 114 in packets to the tiles 118. At block 808, the bridges 322 of the tiles 118 generate memory mapped packets from the packets received at the tiles 118 from the PMC 120. The memory mapped packets include the respective configuration data and respective original destination addresses. At block 810, the memory mapped packets are routed by the memory mapped switches 320 to respective tiles 118 in columns of respective target DPEs 114. At block 812, the address index offset is added to the original destination address by the address index offset logic 324 at the respective tile 118 to create a modified destination address. At block 814, the memory mapped packet includes the configuration data and the modified destination address and is routed in the memory mapped interconnect network based on the modified destination address to the modified target DPE 114. At block 816, a core 202 of the modified target DPE 114 indicated by the modified destination address is programmed based on configuration data in the memory mapped packet.

While the foregoing is directed to specific examples, other and further examples may be devised without departing from the basic scope thereof, and the scope thereof is determined by the claims that follow.

What is claimed is:

1. A programmable device comprising:
a data processing engine (DPE) array comprising:
DPEs disposed in a first integrated circuit (IC) chip, each of the DPEs comprising a processor core and a memory mapped switch, wherein the processor core is programmable via one or more memory mapped packets routed through the respective memory mapped switch, and wherein the memory mapped switches in the DPE array are coupled together to form a memory mapped interconnect network; and
an interface block disposed within the first IC chip and configured to interface between each of the DPEs and one or more subsystems of the programmable device, the interface block comprising a plurality of tiles, each of the plurality of tiles is coupled to a respective one or more of the DPEs, wherein the plurality of tiles comprises address index offset logic configurable to selectively modify which DPE in the DPE array is targeted by a respective memory mapped packet routed in the memory mapped interconnect network, wherein the programmable device is a System-on-Chip (SoC).

2. The programmable device of claim 1, wherein the address index offset logic is configurable to selectively modify an address identification of the DPEs, the respective memory mapped packet being routed in the memory mapped interconnect network based on the address identification.

3. The programmable device of claim 2, wherein the address index offset logic includes an address index offset register and serially connected adders, a first one of the serially connected adders having an input node connected to the address index offset register, each of the serially connected adders having an input node connected to a logical "1" node, each of the serially connected adders having an output node connected to a respective subset of the DPEs, each of the serially connected adders being configured to provide a unique subset identification to the respective subset of the DPEs, the address identification of each DPE including the respective unique subset identification.

4. The programmable device of claim 3, wherein each of the subsets of the DPEs is a row of DPEs in the DPE array.

5. The programmable device of claim 2, wherein the memory mapped interconnect network is configured to route the respective memory mapped packet in the memory mapped interconnect network by comparing a destination address of the respective memory mapped packet to the address identification of each DPE where the respective memory mapped packet is received.

6. The programmable device of claim 1, wherein the address index offset logic is configurable to selectively modify a destination address of the respective memory mapped packet routed in the memory mapped interconnect network, the respective memory mapped packet being routed in the memory mapped interconnect network based on the destination address.

7. The programmable device of claim 6, wherein the address index offset logic includes an adder configured to add an address index offset to the destination address, a configuration register being configured to store the address index offset.

8. The programmable device of claim 1 further comprising a controller configured to transmit configuration data to the DPE array, the configuration data being in one or more memory mapped packets at the DPE array, the one or more memory mapped packets containing the configuration data being routed via the memory mapped interconnect network to one or more of the DPEs, the one or more of the DPEs being programmed by the configuration data.

9. A method for operating a programmable device, the method comprising:
   writing an address index offset to address index offset logic of a plurality of tiles of an interface block in a data processing engine (DPE) array, the DPE array further comprising DPEs, each of the DPEs comprising a processor core and a memory mapped switch, the memory mapped switches in the DPE array being coupled together to form a memory mapped interconnect network, wherein, for each of the DPEs, the processor core is programmable via one or more memory mapped packets routed through the respective memory mapped switch of the DPE, wherein each subset of different subsets of the DPEs is assigned a unique subset identification responsive to writing the address index offset, wherein the DPEs are disposed in a first integrated circuit (IC) chip, the interface block is disposed within the first IC chip and configured to interface between each of the DPEs and one or more subsystems of the programmable device, and each of the plurality of tiles is coupled to a respective one or more of the DPEs; and
   routing a memory mapped packet in the memory mapped interconnect network based on the respective unique subset identification of each DPE in the DPE array that receives the memory mapped packet, wherein the programmable device is a System-on-Chip (SOC).

10. The method of claim 9, wherein the different subsets of the DPEs are respective different rows of the DPEs.

11. The method of claim 9 further comprising, before routing the memory mapped packet, configuring stream switches each in a pass-through mode, each of the DPEs comprising a respective one or more of the stream switches, the stream switches in the DPE array being coupled in a stream interconnect network.

12. The method of claim 9 further comprising reading, by a controller, data indicative of the address index offset from non-volatile memory, the controller causing the address index offset to be written to the address index offset logic based on the read data.

13. The method of claim 9, wherein the address index offset logic includes an address index offset register and serially connected adders, a first one of the serially connected adders having an input node connected to the address index offset register, each of the serially connected adders having an input node connected to a logical "1" node, each of the serially connected adders having an output node connected to a respective subset of the different subsets of the DPEs, each of the serially connected adders being configured to provide the unique subset identification to the respective subset.

14. The method of claim 9, wherein routing the memory mapped packet in the memory mapped interconnect network includes:
   at each DPE in the DPE array that receives the memory mapped packet:
      comparing a destination address of the memory mapped packet to the unique subset identification of the respective DPE;
      when the destination address corresponds to the unique subset identification of the respective DPE, directing data of the memory mapped packet to a memory space internal to the respective DPE; and
      when the destination address does not correspond to the unique subset identification of the respective DPE, routing the memory mapped packet to another DPE in another subset of the different subsets of the DPEs.

15. The method of claim 9 further comprising programming the processor core of a DPE of the DPEs indicated by a destination address in the memory mapped packet, the programming being based on configuration data in the memory mapped packet, the memory mapped packet being routed via the memory mapped interconnect network to the memory mapped switch of the DPE of the DPEs.

16. A method for operating a programmable device, the method comprising:
   receiving a packet comprising an original destination address and configuration data at an interface tile of a plurality of interface tiles of an interface block of a data processing engine (DPE) array, the DPE array further comprising DPEs, each of the DPEs comprising a processor core and a first memory mapped switch, the first memory mapped switches in the DPE array being coupled together to form a memory mapped interconnect network, wherein, for each of the DPEs, the processor core is programmable via one or more memory mapped packets routed through the respective first memory mapped switch of the DPE, wherein the DPEs are disposed in a first integrated (IC) chip, and the interface block is disposed within the first IC chip and configured to interface between each of the DPEs and one or more subsystems of the programmable device;
   adding, at the interface tile, an address index offset to the original destination address to create a modified destination address; and
   routing a memory mapped packet in the memory mapped interconnect network based on the modified destination address, the memory mapped packet including the configuration data and the modified destination address, wherein the programmable device is a System-on-Chip (SoC).

17. The method of claim 16 further comprising, before routing the memory mapped packet based on the modified destination address, configuring stream switches each in a pass-through mode, each of the DPEs comprising a respective one or more of the stream switches, the stream switches being coupled in a stream interconnect network.

18. The method of claim 16 further comprising configuring, by a controller, address index offset logic of the interface tile to add the address index offset to respective original destination addresses of memory mapped packets, wherein adding the address index offset to the original destination address is performed by the address index offset logic.

19. The method of claim 16, wherein adding the address index offset to the original destination address is performed by address index offset logic of the interface tile, the address index offset logic being connected between a second memory mapped switch of the interface tile and the first memory mapped switch of a neighboring one of the DPEs.

20. The method of claim 16 further comprising programming a core of a DPE of the DPEs indicated by the modified destination address based on the configuration data in the memory mapped packet, the memory mapped packet being routed via the memory mapped interconnect network to the first memory mapped switch of the DPE of the DPEs.

21. The programmable device of claim 1 further comprising a second IC chip, wherein the first IC chip and the second IC chip are attached to a substrate, and wherein the interface block is configured to communicate with a subsystem on the second IC chip.

* * * * *